United States Patent [19]
Ogita et al.

[11] Patent Number: 5,358,898
[45] Date of Patent: Oct. 25, 1994

[54] METHOD OF MAKING A TUNABLE LASER DIODE HAVING A DISTRIBUTED FEEDBACK STRUCTURE

[75] Inventors: Shouichi Ogita, Sagamihara; Yuji Kotaki, Hadano; Manabu Matsuda, Atsugi, all of Japan

[73] Assignee: Fujitsu Limited, Kawasaki, Japan

[21] Appl. No.: 171,963

[22] Filed: Dec. 23, 1993

Related U.S. Application Data

[60] Continuation of Ser. No. 987,454, Dec. 7, 1992, abandoned, which is a division of Ser. No. 789,427, Nov. 5, 1991, Pat. No. 5,170,402, which is a continuation of Ser. No. 552,116, Jul. 13, 1990, abandoned.

[30] Foreign Application Priority Data

Jul. 15, 1989 [JP] Japan .................. 1-184144
Sep. 12, 1989 [JP] Japan .................. 1-235928
Sep. 12, 1989 [JP] Japan .................. 1-235929
Sep. 19, 1989 [JP] Japan .................. 1-235930

[51] Int. Cl.$^5$ ........................... H01L 21/203
[52] U.S. Cl. .................... 437/129; 148/DIG. 50
[58] Field of Search .................. 437/129, 133; 148/DIG. 95

[56] References Cited

U.S. PATENT DOCUMENTS

| | | |
|---|---|---|
| 4,847,857 | 7/1989 | Ohkura . |
| 4,895,615 | 1/1990 | Muschke ............... 437/129 |
| 4,932,034 | 6/1990 | Usami et al. . |
| 5,047,364 | 9/1991 | Hattori ................. 437/129 |
| 5,171,706 | 12/1992 | Matsumoto et al. ..... 437/129 |

FOREIGN PATENT DOCUMENTS

| | | |
|---|---|---|
| 0205139 | 6/1986 | European Pat. Off. . |
| 0289250 | 4/1988 | European Pat. Off. . |
| 0332453 | 3/1989 | European Pat. Off. . |

OTHER PUBLICATIONS

Elecronic Letters, Dependence of Spectral Lindewidth on Cavity Length and Coupling Coefficient in DFB Laser, May 12, 1988, vol. 24, No. 10, pps. 613–614.
Electronic Letters, Three-Electrode DFB Wavelength Tunable FSK Transmitter at 1.53 MUM, Jan. 5, 1989, vol. 25, No. 1, pp. 45–47.
Electronic Letters, High Power, Wide-Band-Width, 1.55 MUM-Wavelength GaInAsP/InP Distributed Feedback Laser, Aug. 27, 1987, vol. 23, No. 18, pp. 941–942.
S. Ogita et al., FM Response of Narrow-Linewidth, Multielectrode λ/4 Shift DFB Laser, Mar. 2, 1990, pp. 165–166, New York, U.S. IEEE Photonics Tech. Lett. vol. 2, No. 3.
Patent Abstracts of Japan, vol. 7, No. 111, May 14, 1983 (for JP-A 58 31 590).

*Primary Examiner*—R. Bruce Breneman
*Assistant Examiner*—Linda J. Fleck
*Attorney, Agent, or Firm*—Staas & Halsey

[57] ABSTRACT

A distribution feedback laser diode, comprises a substrate, a waveguide layer provided on the substrate, an active layer provided on the waveguide layer, a diffraction grating provided at an interface between the substrate and the waveguide layer for reflecting an optical radiation formed in the active layer back and forth, a clad layer provided on the active layer for confining the optical radiation within the active layer, a plurality of segmented electrodes provided on the top surface of the clad layer along an elongated direction of the laser diode for injecting the carriers into the active layer, wherein at least one of the segmented electrodes is provided in correspondence to a part of the active layer in which the optical radiation formed in the active layer has a maximum intensity level, and a backside electrode provided at the bottom surface of the substrate for injecting the carriers into the active layer through the substrate.

4 Claims, 22 Drawing Sheets

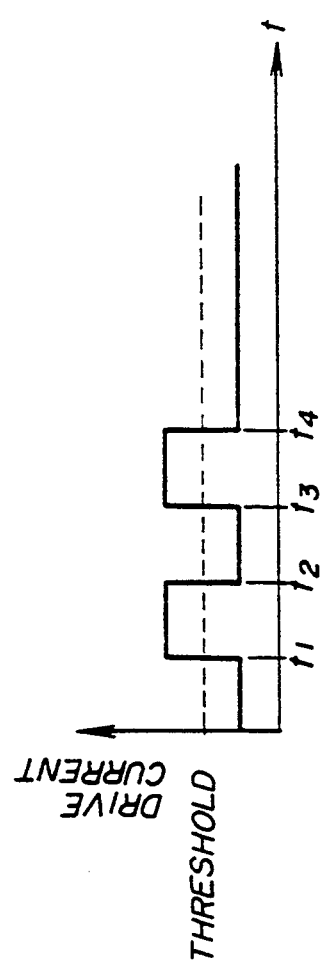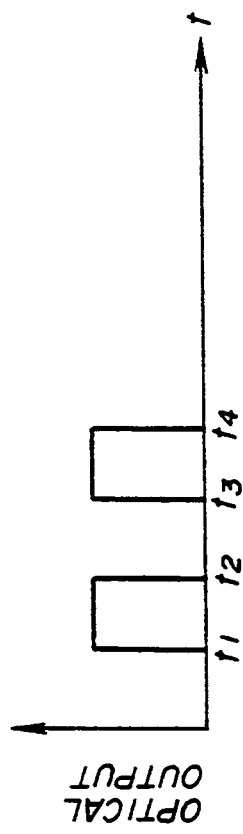
FIG.1A (PRIOR ART)
FIG.1B (PRIOR ART)

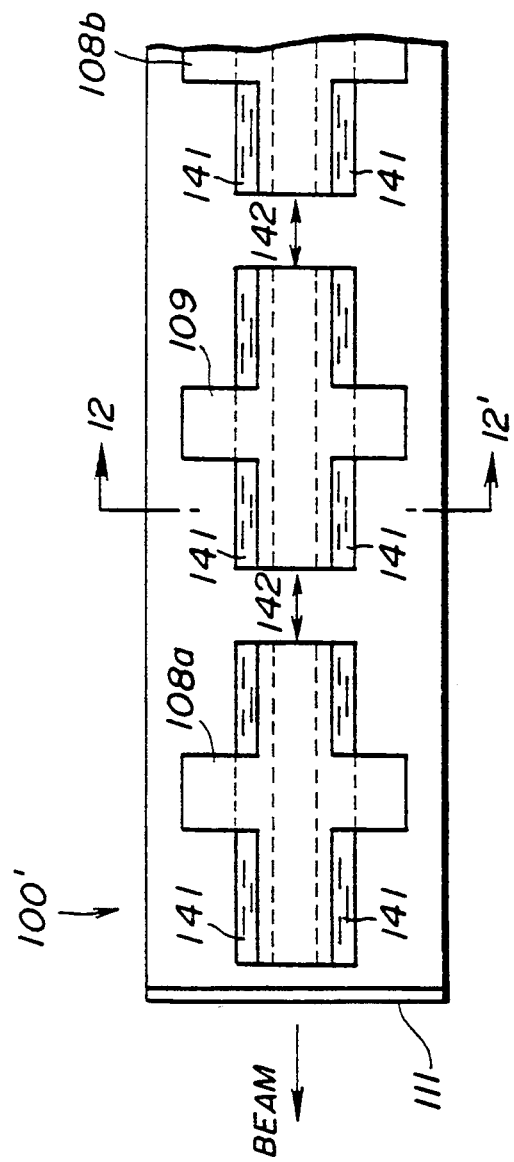

METHOD OF MAKING A TUNABLE LASER DIODE HAVING A DISTRIBUTED FEEDBACK STRUCTURE

This application is a continuation of application Ser. No. 07/987,454, filed Dec. 7, 1992, now abandoned, which is a division of application No. 07/789,429, filed Nov. 5, 1991, now U.S. Pat No. 5,170,402, which is a continuation of 07/552,116, filed Jul. 13, 1990, now abandoned.

BACKGROUND OF THE INVENTION

The present invention generally relates to tunable laser diodes and more particularly to a distributed feedback laser diode having a diffraction grating as reflection means.

In relation to the super-large capacity optical fiber telecommunication system of the next generation, the coherent optical telecommunication system has been studied intensively. In the coherent optical telecommunication system, the information is modulated on a coherent optical beam by frequency shift keying modulation or phase shift keying modulation and is transmitted along an optical fiber network in the form of a modulated optical beam.

The light, being an electromagnetic wave, has frequency components similar to radio waves. As the frequency of light is in the order of 200 THz, which is much higher than the frequency of radio waves, an enormous amount of information can be transmitted when the light is used as the carrier of information transmission.

FIGS. 1A and 1B show an example of the conventional optical telecommunication process using the ordinary amplitude modulation of the optical beam. In such an amplitude modulation of the optical beam, a drive pulse having a magnitude exceeding the threshold level of the laser oscillation as shown in FIG. 1A is applied to the laser diode, and the laser diode produces an optical output as shown in FIG. 1B in response to the turning on and turning off of the laser diode. Alternatively, a separate modulator for selectively passing the optical beam produced by the laser diode may be used. In this case, the laser diode produces an optical beam with a constant optical output, and the modulator absorbs the light in accordance with the information signal to be transmitted. As a result, an optical output similar to that shown in FIG. 1B is obtained.

In the optical telecommunication system based on such an amplitude modulation of the optical beam, however, the wave nature of the light is not fully utilized. As the light has, as already described, frequency components similar to the radio waves, it is expected that a more efficient optical telecommunication system can be achieved when the wave nature of the optical beam is exploited, for example, in the form of frequency modulation.

Meanwhile, it is known that there are laser diodes which can change the oscillation frequency in response to the modulation of the drive current. In other words, the frequency modulation of the output optical beam is made principally possible by using the laser diodes. Thus, the laser diode is expected to provide a simple and effective means for constructing a coherent optical telecommunication system wherein the frequency shift keying (FSK) or phase shift keying (PSK) is employed.

In the coherent optical telecommunication system using a coherent optical beam produced by the laser diode, it is possible to use the so-called heterodyne or homodyne technique for reproducing the information from the transmitted optical beam. This heterodyne or homodyne technique is used commonly in conventional microwave or radio wave telecommunications, including the ordinary television or radio set. In the heterodyne detection of the information, a received signal is mixed with a local signal produced by a local oscillator and an intermediate frequency signal is extracted after suitable filtering as a beat caused by the interference of the received signal and the local signal. More specifically, when a signal having a frequency of $f1 +/- \Delta f1$ is received and mixed with a local signal having a frequency $f1$ from the local oscillator, an intermediate frequency signal $\Delta f1$ is obtained as a result of interference between both signals. By using a number of central frequencies $f1$, $f2$, $f3$, $f4$, . . . in correspondence to a number of frequency channels, it is possible to send a large amount of information in accordance with the frequency division multiplex procedure. In the reception side, one can selectively reproduce the desired information signal from a selected channel by setting the frequency of the local oscillator suitably.

In such a coherent optical beam telecommunication system, the laser diode used in the transmission side is expected to change the oscillation frequency freely about a suitably chosen central frequency $f1$. In other words, a tunable laser diode has to be used for producing the frequency modulated optical beam. Thereby, it is desired that the optical output power not change with the change of the oscillation frequency. Further, it is desired that the optical beam produced by the laser diode have a sharply defined spectrum. When the spectrum of the produced optical beam is broad, a relatively wide frequency band is needed for each channel and associated therewith, a large frequency shift is required for the oscillation frequency of the laser diode. Further, associated with the broad spectrum of the output optical beam, the number of channels which can be secured at the time of a telecommunication made in the frequency division multiplex mode is decreased.

In laser diodes, the change of the oscillation frequency is caused in response to the change of the output optical power of the laser diode, as the change of the oscillation frequency is caused in response to the modulation of the refractive index of the resonator of the laser diode which in turn is caused in response to the modulation of the drive current. When the output power is changed in response to the frequency change, such a change of the output power or amplitude produces a side band of which the frequency changes in response to the modulation signal, and such a side band acts as a noise to the transmitted information.

Meanwhile the distributed feedback (DFB) type laser diode is known conventionally as a laser diode which is capable of changing the oscillation frequency relatively in a wide frequency range. FIGS. 2A and 2B show an example of the conventional DFB laser diode having a single electrode, wherein FIG. 2A shows the transversal cross-section and FIG. 2B shows a longitudinal cross-section.

Referring to the longitudinal cross-section of FIG. 2B, the laser diode has a buried structure including an n-type InP substrate 201, a diffraction grating 202 formed thereon, an n-type GaInAsP waveguide layer 203 provided on the grating 203, an intrinsic type active layer 204 of GaInAsP provided on the waveguide layer 203, and a clad layer 205 of p-type InP provided on the active layer 204. Further, an electrode 206 and an electrode 208 are provided respectively on a top surface of the clad layer 205 and on a bottom surface of the substrate 201. Thereby, there is formed a diode structure having the p-type region 205 and the n-type region 203 across the active layer 204. Further, the layers 203 and 205, having a lower refractive index, form together with the active layer 204 having a higher refractive index and sandwiched therebetween, an optical confinement structure for confining the optical beam in the active layer 204.

Referring now to the transversal cross-section of FIG. 2A, the active layer 204 and the waveguide layer 202 form together with a part of the substrate 201 a mesa structure, wherein a p-type buried layer 211 of InP supports both sides of the mesa structure laterally. In the p-type buried layer 211, there is provided another buried layer 212 of n-type InP such that a p-n junction 13 is formed along the boundary between the layer 211 and the layer 212.

At the p-n junction 13, and thus at both sides of the mesa structure, there is formed a depletion region which prohibits the invasion of carriers, and there occurs a concentration of carriers along a current path passing through the active layer 204. Thereby, an effective injection of the carriers in the active layer 204 is achieved. Further, the buried layer 211 acts also as the optical confinement layer for laterally confining the optical beam in the active layer 204. Thus, there occurs a laser oscillation in response to the injection of a current from the electrode 206 toward the electrode 208.

In such a conventional DFB laser diode, it is known that there occurs a change of the oscillation wavelength in response to the drive current injected via the electrode 206.

FIG. 2C shows a typical example of the frequency versus modulation characteristic of such a conventional DFB laser diode, wherein the efficiency of modulation defined as the frequency shift in response to the unit amplitude change of the amplitude modulated drive current is plotted against the frequency. As can be seen from FIG. 2C, the efficiency of modulation decreases significantly in the frequency range between about 10 MHz and 100 MHz. Such a change of the efficiency of modulation with the frequency causes a complicated problem in the frequency modulation of the optical beam produced by the laser diode.

The decrease of the efficiency of modulation in the intermediate frequency range as shown in FIG. 2C is believed to be caused as a result of cancellation of the thermally induced modulation effect which is predominant in the frequency range below about 100 MHz and the modulation effect caused by the interaction of the carriers and photons which is predominant in the frequency range above about 100 MHz. More specifically, the effect of the thermally induced modulation causes a red shift of the oscillation wavelength toward the longer wavelength side when there is an increase in the driving current, as such an increase of the driving current causes an increase in the refractive index. On the other hand, in the case of the modulation caused by the interaction of the carriers and the photons, the increase in the carriers in the active layer due to the increase in the driving current induces a decrease of the refractive index and there occurs a blue shift of the oscillation wavelength toward the shorter wavelength side.

On the other hand, there is another type of known DFB laser diode which can shift the oscillation wavelength widely and stably in response to the drive current and is still capable of providing an optical output with a sharply defined spectrum. In this type of the laser diode, the electrode at the top surface of the clad layer 205 is divided into a number of electrode segments (Y. Yoshikuni et al., Broad Wavelength Tuning Under Single-mode Oscillation with a Multi-electrode Distributed Feedback Laser, Electronics Letters, vol. 22, Oct. 23, 1986).

FIG. 3 shows a typical example of such a prior art multi-electrode DFB laser diode, wherein the laser diode has a structure similar to that of FIG. 1 except that the electrode 206 is divided into a plurality of electrode segments 206a and 206b. In operation, the ratio of a drive current I1 which is injected via the electrode segment 206a with regard to a drive current I2 which is injected via the electrode segment 206b is changed. In response thereto, there is induced a change in the carrier concentration and associated therewith, a non-uniform distribution of the light intensity appears in the active layer 204 as illustrated in FIG. 3. Such a non-uniform distribution of the light intensity induces the localized change in the carrier density which in turn induces a corresponding change in the refractive index in the active layer 204 as well as in the waveguide layer 203. Such a change in the refractive index induces a change in the effective pitch of the diffraction grating, and in response thereto, there occurs a change in the oscillation frequency. It should be noted that the non-uniform distribution of the carrier density induces not only the change of the refractive index in the active layer but also a non-uniform distribution of the gain. Thereby, the condition of the laser oscillation with respect to the amplitude and the phase of the optical radiation may be changed in response to the non-uniform distribution of the carriers. Thus, such a non-uniform distribution of the refractive index and the gain combined together cause a change in the threshold carrier density which corresponds to the overall number of carriers in the active layer and as a result, there occurs the foregoing change in the oscillation wavelength and the optical output of the laser diode.

FIG. 4 shows an example of the frequency shift of the oscillation wavelength in response to a parameter R defined as $R = I1/(I1+I2)$ wherein I1 stands for the current injected via the electrode segment 206a and I2 stands for the current injected via the electrode segment 206b. As can be seen in FIG. 4, the oscillation wavelength is decreased, as compared to the case of R=0.5, when the current I1 is decreased (R=0.2), while it is increased when the current I1 is increased (R=0.7). Further, the laser diode of FIG. 3 has a preferable feature such that the produced optical beam has a sharply defined spectrum with a width of several tens of MHz and the laser diode can provide an optical power of several milliwatts.

However, the conventional DFB laser diode shown in FIG. 3 has a serious problem in that the optical output power changes in response to the oscillation wavelength when the parameter R is changed by simply changing the current I1 and I2 independently. In order to obtain the frequency shift of the laser oscillation while maintaining a constant output power, it is necessary to change the current I1 and I2 simultaneously. It should be noted that the control of the current I1 and the current I2 is a complicated process as such a change induces both a frequency shift and a change of the optical output power and there is needed a complex control system for achieving the desired frequency modulation without causing a modulation of the amplitude.

Further, the conventional DFB laser diode has a problem in that it can provide only a limited frequency range in which the efficiency of modulation remains substantially constant. For example, the. DFB laser diode of FIG. 3 can provide a frequency range of only about 1 GHz in which the modulation characteristic of the laser diode is substantially flat, while a frequency range of about 10 GHz or more is needed in the actual optical telecommunication system.

SUMMARY OF THE INVENTION

Accordingly, it is a general object of the present invention to provide a novel and useful DFB laser diode wherein the foregoing problems are eliminated.

Another object of the present invention is to provide a tunable DFB laser diode capable of changing the oscillation frequency in a wide frequency range while producing an optical beam with a sharp spectrum.

Another object of the present invention is to provide a tunable DFB laser diode capable of shifting the oscillation wavelength in response to a modulation signal while maintaining the optical output power constant under a simple control procedure.

Another object of the present invention is to provide a tunable DFB laser diode of a buried structure with segmented electrodes provided thereon wherein the laser diode is capable of operating with a high modulation frequency range.

Another object of the present invention is to provide a fabrication method of a tunable DFB laser diode having a buried structure and segmented electrodes provided thereon for high speed operation.

Another object of the present invention is to provide a tunable DFB laser diode comprising an active layer and a diffraction grating provided in the vicinity of the active layer, wherein a first segmented electrode is provided in correspondence to a portion of the active layer in which the intensity of the optical radiation established in the active layer assumes a maximum level and wherein second and third segmented electrode are provided in correspondence to portions of the active layer in which the intensity of the optical radiation in the active layer assumes a minimum level. In operation, a modulation signal is applied to the first segmented electrode while injecting drive currents through the second and third segmented electrodes for sustaining the laser oscillation. Thereby, a modulated drive current is injected into the portion of the active layer in which the carrier density is reduced to the minimum in correspondence to the maximum level of the optical radiation. In response to the injection of the carriers into such a portion, the carrier density is changed significantly and thereby a large change in the refractive index is induced in response to the modulation signal. As a result, the oscillation wavelength of the laser diode is changed because of the change in the effective pitch of the diffraction grating. The overall output power of the DFB laser diode is controlled constantly by changing the drive currents injected through the second and third segmented electrodes so as to compensate for the change in the optical output power caused by the modulated drive current. It should be noted that such a change in the drive current in the portions where the intensity of the optical radiation is minimum causes little shifting of the oscillation wavelength and the output power can be controlled substantially independently from the oscillation wavelength.

In a preferred embodiment of the present invention, optical detection means is provided for detecting the change in the optical output power caused in response to the shifting of the oscillation wavelength, and a controller is used for controlling the drive currents to be supplied to the second and third segmented electrodes for compensating for the change in the optical output power. Thereby, frequency modulation of the optical output beam produced by the DFB laser diode is achieved without causing a change in the optical output power.

Other objects and further features of the present invention will become apparent from the following detailed description when read in conjunction with the attached drawings.

BRIEF DESCRIPTION OF THE DRAWINGS

FIGS. 1A and 1B are diagrams showing an example of the modulation of an optical beam used conventionally, wherein the optical output power from a laser diode is turned on and turned off in response to a modulation signal to be transmitted;

FIG. 12A is a plan view showing a part of the DFB laser diode according to a second embodiment of the present invention;

DETAILED DESCRIPTION

Hereinafter, a first embodiment of the present invention will be described.

Figure 5A:
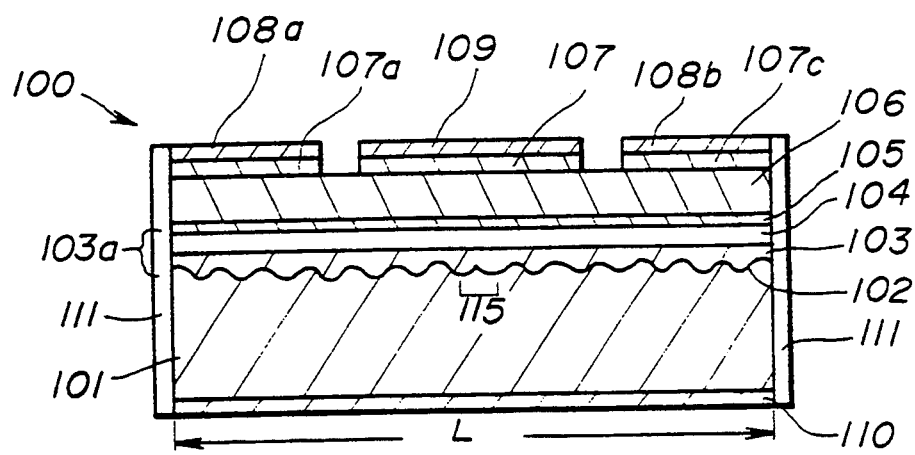
FIGS. 5A and 5B are respectively a longitudinal cross-sectional view and a transversal cross-sectional view showing a first embodiment of the DFB laser diode of the present invention.

Referring to FIG. 5A showing a longitudinal cross-sectional view, the DFB laser diode of the first embodiment, represented generally by a numeral 100, includes an n-type InP substrate 101 and a waveguide layer 103 provided thereon. The waveguide layer 103 may comprise a GaInAsP layer having a layer thickness d of about 0.1 μm and an electro-luminescence (EL) wavelength $\lambda_g$ corresponding to the band gap energy of about 1.3 μm. The layer 103 may be doped to the n-type with an impurity concentration level of $5 \times 10^{17}$ cm$^{-3}$.

As illustrated in the cross-sectional view of FIG. 5A, there is formed a corrugation or diffraction grating 102 having a pitch of about 2400 Å and a depth of about 300–400 Å. Further, there is formed a phase shift region 115 in the diffraction grating 102 generally in correspondence to the center thereof such that the phase of the corrugation is shifted by a quarter of the wavelength of the corrugation forming the diffraction grating 102. As will be described later, this phase shift region 115 acts to induce an unhomogeneous distribution of the optical radiation in an active layer 104 such that there appears a maximum of the intensity of the optical radiation in correspondence to the phase shift region 115.

On the waveguide layer 103, there is provided the foregoing active layer 104 with a thickness of about 0.1 μm. The active layer 104 comprises an undoped GaInAsP layer and has an EL wavelength $\lambda_g$ of about 1.55 μm. The active layer 104 and the waveguide layer 103 form a resonator structure 103a. Further, in order to protect the active layer 104, an anti-meltback layer 105 of a p-type GaInAsP, doped to an impurity concentration level of $5 \times 10^{17}$ cm$^{-3}$ and having an EL wavelength $\lambda_g$ of 1.3 μm, is provided with a thickness of 0.06 μm. Further, a clad layer 106 with a thickness of about 1–2 μm of a p-type InP layer having an impurity concentration level of $5 \times 10^{17}$ cm$^{-3}$ is provided on the anti-meltback layer 105.

Further, an n-type ohmic electrode 110 of gold-germanium/gold structure is provided on a bottom surface of the substrate 101 for making an ohmic contact. On the clad layer 106, a contact layer 107 of p+-type GaInAsP having an impurity concentration level of $1 \times 10^{19}$ cm$^{-3}$ is provided with a thickness d of 0.2 μm such that the contact layer 107 is divided into three distinct segments, one (107a) in correspondence to an end of the structure 100, one (107b) in correspondence to the phase shift region 115 and one (107c) in correspondence to the other end of the structure 100. Further, a first segmented electrode 108a, a second segmented electrode 109 and a third segmented electrode 108b are provided respectively on the segmented contact layers 107a –107c so as to form an ohmic contact therewith. Further, an anti-reflection film 111 is provided at both ends of the DFB structure 100. This anti-reflection film 111 may comprise a thin film of silicon nitride having a thickness of about 2000 Å which is about one quarter of the oscillation wavelength of the laser diode.

Figure 5B:
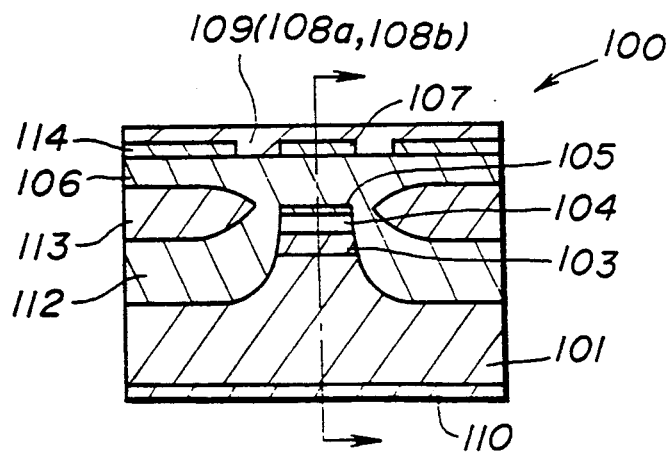

FIG. 5B shows a transversal cross-section of the laser diode structure 100. As can be seen from FIG. 5B, the waveguide layer 103, the active layer 104 and the anti-meltback layer 105 on the top of the active layer 104 form a mesa structure, and both sides of the mesa structure are supported by a pair of p-type InP layers 112. In other words, the laser diode 100 has a buried structure wherein the mesa structure including the waveguide layer 103 and the active layer 104 is laterally bounded by the p-type InP layers 112 and vertically bounded by the clad layer 106 and the substrate 101. Further, a pair of n-type InP buried layers 113 are provided within the p-type InP layer 112 such that the buried layers 113 are opposite to each other at both sides of the mesa structure. Further, an insulator layer 114 of silicon oxide and the like is provided on the top surface of the clad layer 106 such that drive currents are injected into the active layer 104 via respective segmented electrodes 108a, 108b and 109.

In such a structure, the carriers injected through the segmented electrodes 108a, 108b or 109 and flowing towards the electrode 110 at the bottom of the substrate 101 are confined laterally into a path which passes through the active layer 104 because of the depletion region (not shown) formed in correspondence to the p-n junction extending along the boundary between the p-type InP layer 112 and the n-type InP layer 113 and an effective injection of the carriers into the active layer 104 is achieved.

As the active layer 104 has a refractive index which is higher than the refractive index of the semiconductor layers 103, 105, 106, 112 or 113 surrounding the active layer 104, the optical radiation formed in the active layer 104 as a result of recombination of the carriers is confined within the active layer and the intensity of the optical radiation becomes maximum in the active layer 104.

In the DFB laser diode wherein the laser oscillation is caused as a result of the Bragg reflection of optical waves by the diffraction grating, there is a tendency that the intensity of the optical radiation assumes a maximum generally in correspondence to the center of the diffraction grating or resonator which extends along the longitudinal direction of the laser diode. This is because the optical beams propagating in one direction after a reflection by the diffraction grating and the optical beams propagating in another, opposite direction after a reflection by the diffraction grating interfere most strongly at the center of the diffraction grating which coincides with the center of symmetry of the diffraction grating.

Figure 6:
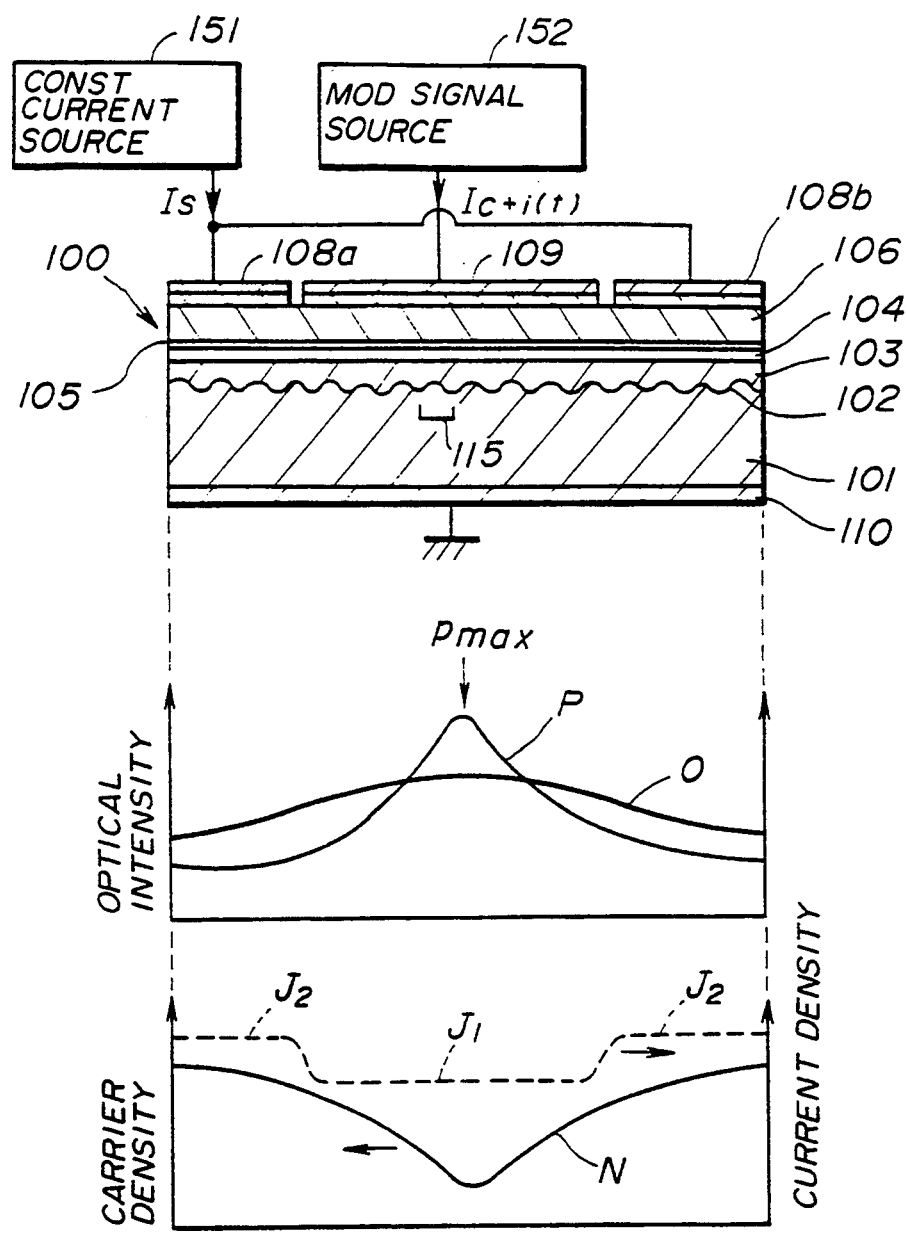
FIG. 6 is a diagram for explaining the operational principle of the DFB laser diode shown in FIGS. 5A and 5B.

In the present invention, there is provided the foregoing phase shift region 115 generally in coincidence with the center of the diffraction grating 102. By forming the region 115 as such, there exists a strong optical radiation in the resonator structure 103b at the region 115 coinciding with the center of symmetry as already described, while at the positions offset from the region 115, the intensity of the optical radiation is decreased significantly because of the loss of symmetry. More specifically, at a first region of the diffraction grating with respect to the phase shift region, the condition of forming a strong Bragg reflection by the interference of the optical radiation formed in the first region and the optical radiation formed in a second region at the opposite side of the phase shift region 115 and coming into the first region across the phase shift region 115 is lost because of the change in the optical path occuring at the phase shift region 115. It should be noted that the phase of the corrugation forming the diffraction grating at one side of the region 115 is shifted with respect to the phase of the corrugation in the other side by $\lambda/4$ where $\lambda$ is the wavelength of the corrugation forming the diffraction grating 102. FIG. 6 shows the distribution of the optical radiation in the resonator structure 103a including the active layer 104 in the case where the phase shift region 115 is not provided and in the case where the phase shift region 115 is provided respectively by a curve O and a curve P. As can be seen in FIG. 6, there appears a distinct peak in the intensity of the optical radiation in the resonator structure 103a. In other words, the phase shift region 115 acts as a means for concentrating the intensity of the optical radiation formed in the resonator structure 103a in a limited region.

In the present embodiment, the segmented electrode 109 is provided in correspondence to the phase shift region 115 where the intensity of the optical radiation is maximum while the other segmented electrodes 108a and 108b are provided respectively in correspondence to the region where the intensity of the optical radiation is minimum. Each of the segmented electrodes 108a, 108b and 109 has a structure wherein a titanium layer, a platinum layer and a gold layer are stacked consecutively and makes an ohmic contact with the underlying contact layer 107 as already described. As illustrated in FIG. 6, a drive current Is is supplied from a constant current source 151 to the segmented electrodes 108a and 108b for driving the laser diode and a drive current Ic is supplied from a modulation signal source 152 together with a modulation signal i(t) superposed on the drive current Ic.

Next, the operation of the DFB laser diode of the present invention will be described with reference to FIG. 6.

Referring to the drawing, there is formed a peak Pmax in the distribution of the optical intensity P in the resonator structure 103a as already described. In such a case, the carriers in the active layer 104 are consumed most strongly in the region where the intensity of the optical radiation assumes the maximum because of the facilitated recombination of the carriers. In FIG. 6, such a distribution of the carriers is illustrated by a curve N. It can be seen clearly that the curve P is inversely proportional to the curve N.

By choosing the drive current Ic such that there occurs the intensity distribution of the optical radiation as such, the carrier density changes significantly in the active layer 104 immediately below the electrode 109 in response to the modulation signal i(t) superposed on the drive current Ic, and in correspondence thereto, there is a change in the refractive index in the active layer 104 of a large magnitude. In other words, the wavelength of the laser oscillation can be changed significantly in response to the modulation signal i(t) overlapped on the drive current Ic and an efficient frequency modulation can be achieved.

Figure 3:
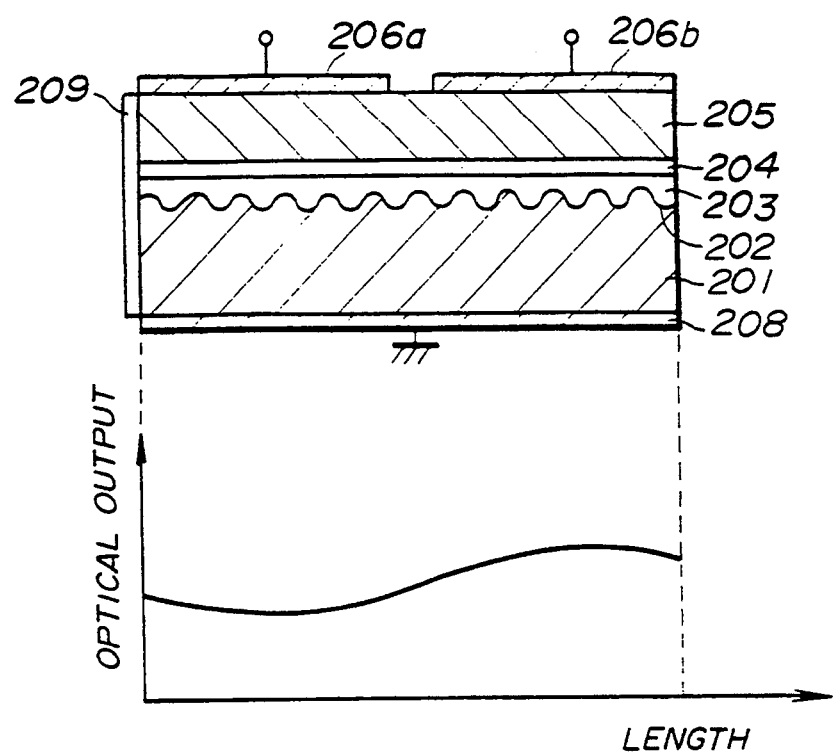
FIG. 3 is a longitudinal cross-sectional view of another prior art DFB laser diode and its modulation characteristic.
Figure 4:
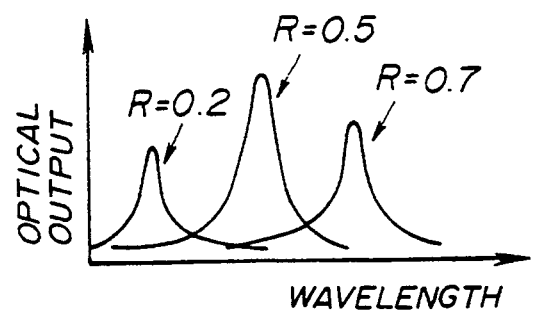
FIG. 4 is a graph showing the operation of the DFB laser diode of FIG. 3.

When the carriers are injected into the region of the active layer 104 where the intensity of the optical radiation is the maximum and the carriers are strongly depleted, the carrier density is changed significantly even when the injected current is small. Thereby, the change in the threshold carrier density explained previously with reference to the prior art laser diode of FIG. 3 is caused quite effectively and the foregoing large shift of the oscillation wavelength is obtained. Particularly, when the current Ic is increased so as to supply the carriers to the region where the carriers are strongly depleted, the threshold carrier density of the laser diode is decreased and the oscillation wavelength is increased in response thereto. Such an increase of the oscillation wavelength occurs in the same sense as in the case of the thermally induced modulation effect. Therefore, an increase in the range of the frequency shift is achieved in the low frequency range of the modulation signal while in the high frequency range of the modulation signal, a flat modulation characteristic is obtained.

In the case where the current Is is increased, on the other hand, the non-uniform distribution of the carriers is further enhanced and associated therewith, the threshold carrier density is increased and the overall number of the carriers in the active layer is increased also. Thereby, the oscillation wavelength of the laser diode is decreased. As the direction of shift of the oscillation wavelength in this case is opposite to the case where the shift is caused by the thermally induced modulation, the change in the oscillation wavelength in response to the change in the threshold current density cancels out with the change caused by the thermally induced modulation and no substantial change occurs in the oscillation wavelength. In any case, the magnitude of change of the oscillation wavelength is small in this case, as the injection of the carriers is made into the region where there are already sufficient carriers.

In the present embodiment, it is preferred that the current density designated as J1 formed in the active layer 104 in response to the injection of the current Ic from the electrode 109 be set equal to or smaller than the current density designated as J2 formed in the active layer 104 in response to the injection of the current Is from the electrode 108a or 108b. As can be seen in FIG. 6, the current density J1 appears in response to the center of the active layer 104 and the current density J2 appears in response to both ends of the active layer 104. By setting the current density J1 and the current density J2 as such (J1≦J2) in the unbiased state where there is no modulation signal i(t) applied to the electrode 109, the efficiency of frequency modulation in response to the application of the modulation signal i(t) can be maximized. It should be noted that, by setting the carrier density J1 to be smaller than J2, the carriers to be injected into the region where the depletion of the carriers has occured are further reduced. Thereby, a small change in the carrier density cause a large change in the oscillation wavelength and the efficiency of modulation is increased. Further, as the laser diode is operated in the state that there is a gain in every regions in the resonator structure 103a, a resonant phenomenon occurs between the carriers and the photons and thereby a modulation with a signal having a frequency of more than 10 GHz can be achieved.

In contrast, in the case of the conventional DFB laser diodes having, for example, a plurality of electrodes shown in FIG. 3, the electrodes are provided without particular consideration with regard to the distribution of the optical intensity in the resonator and thus, the electrodes do not generally correspond to the maximum or minimum of the intensity of optical radiation. Thereby, the modulation caused by the change in the carrier density and the modulation caused by the thermally induced modulation effect are cancelled with each other to a considerable extent. Further, the DFB laser diode of FIG. 3 is driven such that the laser oscillation is sustained by injecting a sub-threshold level modulation current through the electrode 206a for modulating the refractive index in the corresponding part of the active layer while injecting the drive current needed for the laser oscillation through the electrode 206b. Thus, there is caused no significant maximum in the distribution of the intensity of optical radiation, but instead, a nearly uniform distribution is obtained as shown in FIG. 3, contrary to the case shown in FIG. 6. In the foregoing conventional laser diode having the segmented electrodes shown in FIG. 3, although the efficiency of frequency modulation may be improved, there arises a problem in that the frequency response is limited by an upper limit frequency of about 1 GHz corresponding to the lifetime of carriers for the spontaneous emission as shown in FIG. 7 by a continuous line designated as PRIOR ART.

Figure 2A:
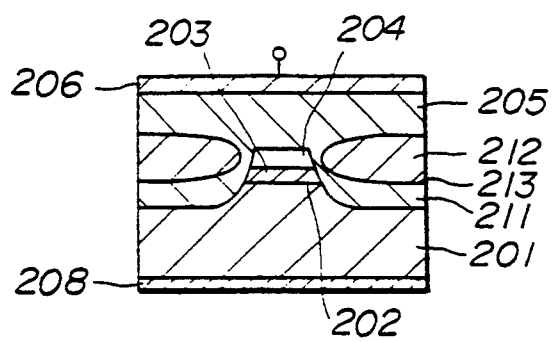
FIGS. 2A and 2B respectively a transverse cross-sectional view and a longitudinal cross-sectional view of a prior art DFB laser diode.
Figure 2B:
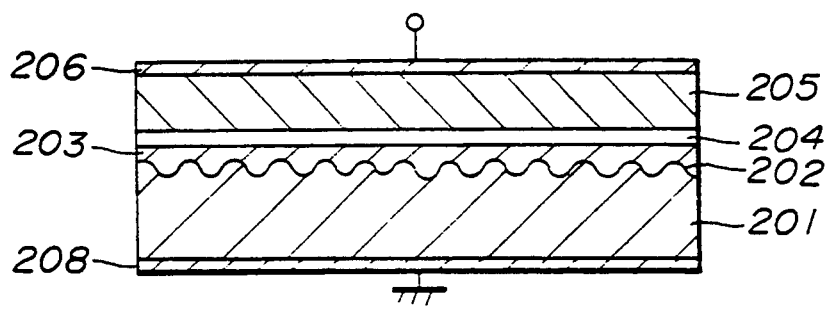
Figure 2C:
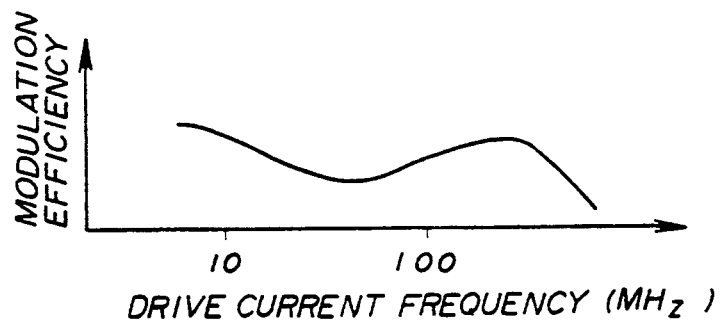
FIG. 2C is a graph showing a frequency versus modulation characteristic of the prior art DFB laser diode of FIGS. 2A and 2B.
Figure 7:
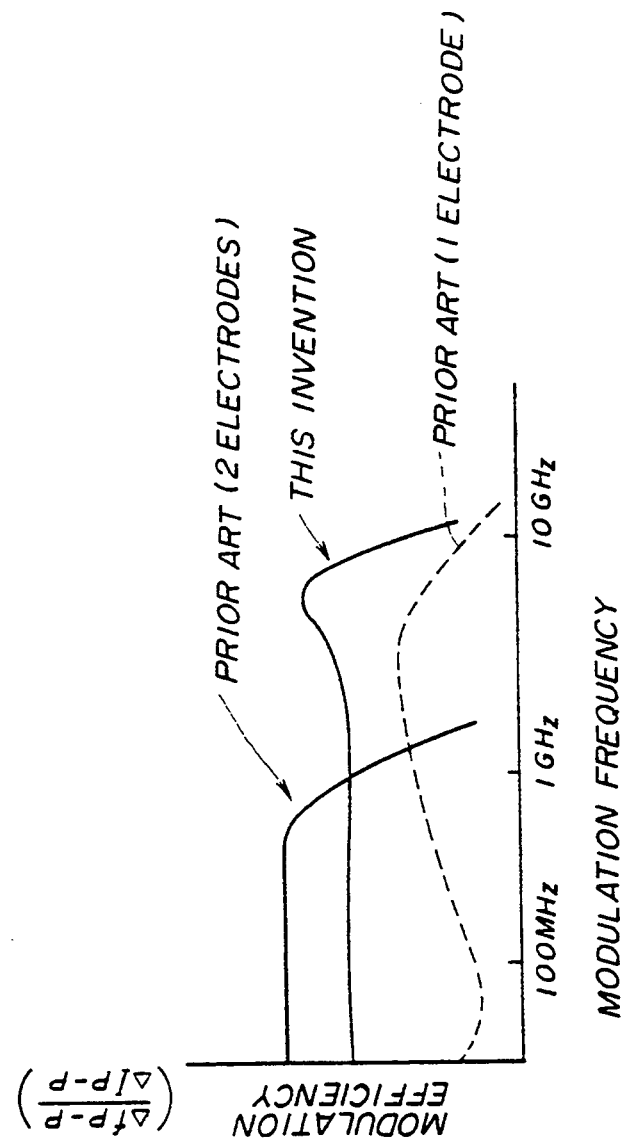
FIG. 7 is a graph showing the modulation characteristic of the laser diode of FIGS. 5A and 5B in comparison with the conventional laser diodes.

FIG. 7 shows the efficiency of modulation achieved by the DFB laser diode of the present embodiment in comparison with the prior art DFB laser diodes shown in FIG. 2B and FIG. 3, wherein the continuous line bearing the label "PRIOR ART" represents the result for the case of the laser diode of FIG. 3 and the broken line bearing the label "PRIOR ART" represents the result for the case of the laser diode of FIG. 2B. The continuous line designated as "THIS INVENTION" represents the modulation achieved by the laser diode of the present embodiment. As can be seen clearly from FIG. 7, the conventional laser diode of FIG. 3 having two electrodes shows a characteristic which drops steeply when the frequency has exceeded about 1 GHz. In the case of the laser diode of FIG. 2B, on the other hand, the efficiency of modulation is decreased in correspondence to the intermediate frequency range between 10 MHz and 100 MHz as already described. In contrast, in the case of the present invention, a sufficient efficiency is obtained up to the frequency of about 10 GHz.

Figures 8A, 8B:
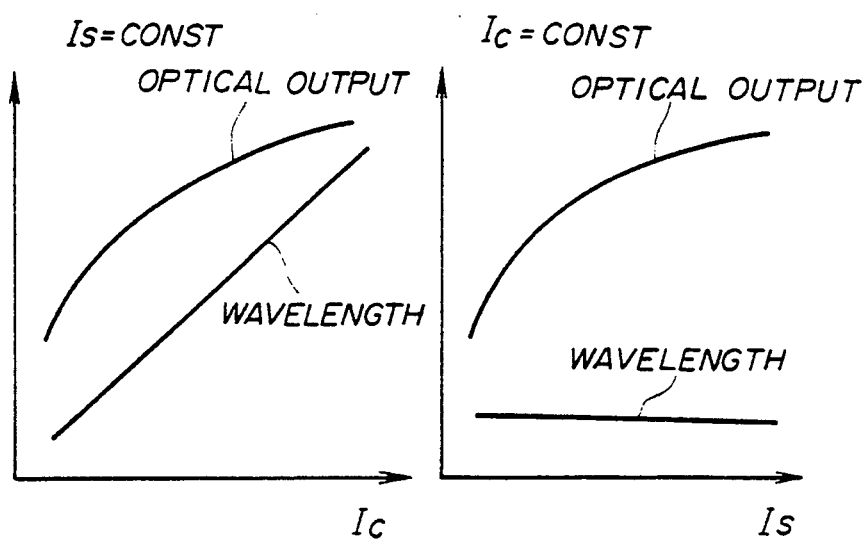
FIGS. 8A and 8B are graphs showing the relation between the oscillation wavelength and the optical output power of the laser diode of FIGS. 5A and 5B as a function of the drive current.

FIGS. 8A and 8B are diagrams showing the output characteristic of the system of FIG. 6 in the case that the current Ic and the current Is are changed, wherein FIG. 8A shows a case in which the current Is, supplied to the segment electrodes 108a and 108b, is held constant and the current Is supplied to the electrode 109 is changed, while FIG. 8B shows the case in which the current Ic is held constant and the current Is is changed.

As can be seen from FIG. 8A, there occurs a large change in the oscillation wavelength generally in proportion to the drive current in addition to the change in the optical output power in the case that the drive current Ic supplied to the electrode 109 is changed. In the case that the current Is to the electrode 108a or 108b is changed, on the other hand, there occurs little change in the oscillation wavelength of the laser diode and only the output power of the laser diode changes. In other words, in the system of FIG. 6, the output power of the laser diode can be changed independently from the oscillation wavelength by changing the drive current Is injected through the electrodes 108a and 108b. By controlling the current Is and the current Ic simultaneously, it is possible to construct a system which produces a frequency modulated coherent optical beam with a constant optical output power.

Figure 9:
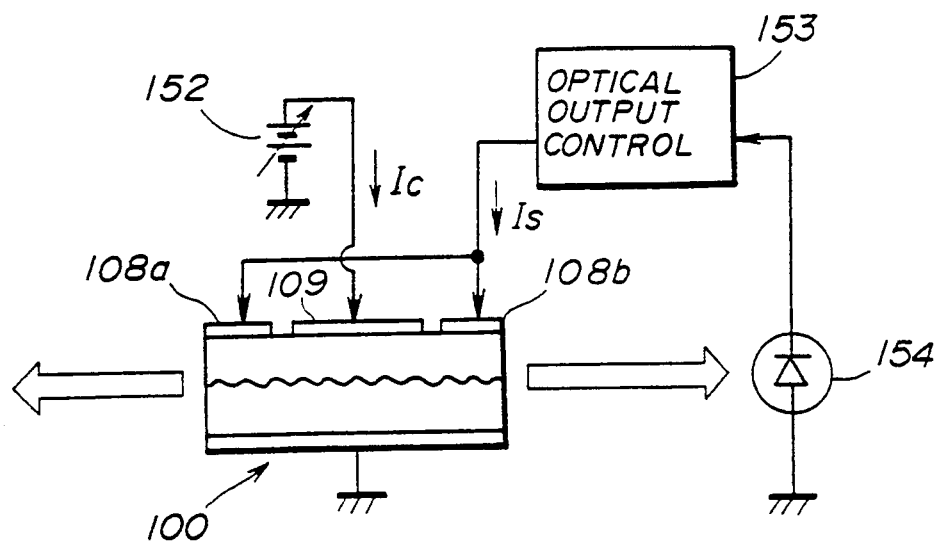
FIG. 9 is a block diagram schematically showing a control system for maintaining the optical output power constant during the frequency modulation of the optical beam.

FIG. 9 shows a system for producing a frequency modulated coherent optical beam with a constant optical output power.

Referring to FIG. 9, the system includes, in addition to the foregoing laser diode 100 and the modulation signal source 152, a photodetector 154 provided at one side of the laser diode 100 for detecting the output power of the laser diode and a controller 153 for controlling the current Is in response to the optical output from the laser diode 100. The controller 153 controls such that the current Is is decreased in response to the increase of the optical output of the laser diode 100 and such that the current Is is increased in response to the decrease of the optical output of the laser diode 100 based on the detection by the photodetector 154.

As already described with reference to FIGS. 8A and 8B, the optical output power of the laser diode 100 can be changed independently from the oscillation wavelength by controlling the drive current Is. Thus, the change in the output power caused in response to the frequency modulation of the output optical beams can be compensated for by the controller 153 by simply increasing or decreasing the current Is in response to the output power detected by the photodetector 154. Thereby, the operation performed by the controller 153 can be simplified significantly.

Figure 10:
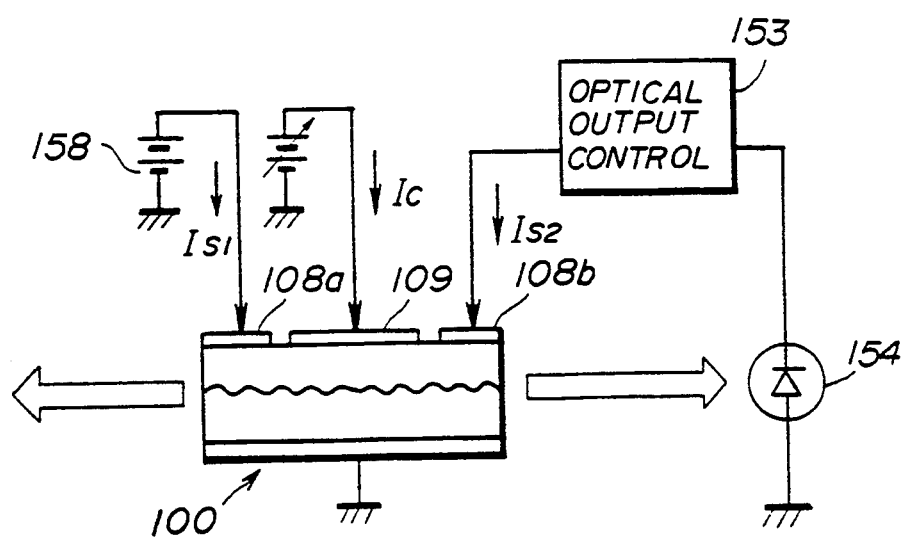
FIG. 10 is a block diagram showing another control system for maintaining the optical output power constant during the frequency modulation of the optical beam.

FIG. 10 shows a modification of the system of FIG. 9 in which a fixed power source 155 is used for supplying a constant drive current Ic1 to the electrode 108a, and the controller 153 supplies a variable drive current Is2 to the segmented electrode 108b. A feedback control similar to the system of FIG. 9 is made such that the output optical power is monitored by the photodetector and the current Is2 is changed by the controller 153 in response to the detected output power.

According to the system of FIG. 9 or FIG. 10, the control of the oscillation wavelength and the output optical power of the laser diode can be achieved independently and the control performed by the controller 153 for maintaining the output optical power constant is significantly simplified.

In the laser diode of the first embodiment, it is preferable that the overall length of the resonator structure 103a, which is defined as a distance L between the pair of opposing anti-reflection films 111 in FIG. 5A, be set to about 500 μm or more for achieving a large frequency variation. By increasing the length of the resonator beyond about 500 μm, the proportion of the light produced as a result of the stimulated emission as against the proportion of the light produced as a result of the spontaneous emission is increased, and this increasing of the length of the resonator is also responsible for the frequency shift of the laser oscillation. Thereby, the range of frequency shift is increased. As a result, the width of the spectrum of the output optical beam can be decreased to about 2 MHz or even several hundred MHz. Further, by increasing the length of the laser diode beyond about 500 μm, the heat generated upon laser oscillation is effectively dissipated. This feature is advantageous for increasing the output optical power of the laser diode. In addition to the foregoing, ordinary advantages associated with the use of a longer resonator, the use of the resonator with an increased length is particularly preferable in the DFB laser diode of the present invention, as such a laser diode having resonator with an increased length shows a distribution of the optical radiation along the longitudinal direction of the laser diode such that a large concentration of the optical radiation appears in correspondence to the central part of the resonator. This feature is particularly advantageous in the laser diode of the present invention for increasing the frequency range of the laser diode.

Figure 11:
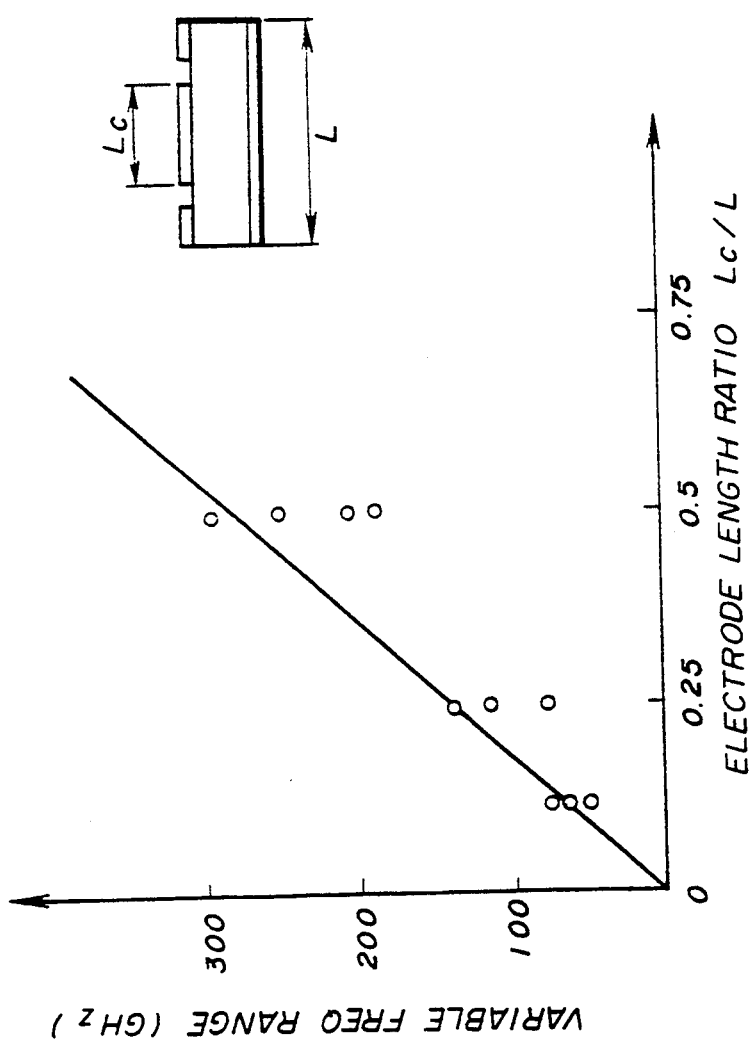
FIG. 11 is a graph showing the relationship between the range of variable frequency and the size of the electrode provided on the DFB laser diode.

FIG. 11 is a graph showing a relationship between the length Lc of the segmented electrode 109 and the variable range of oscillation frequency of the laser diode. As can be seen in FIG. 11, the frequency range increases as the length Lc of the electrode 109 increases. In order to achieve a frequency range of more than 100 GHz, it is desired that the ratio of the electrode length Lc chosen with respect to the overall length L of the resonator be more than 0.25.

It should be noted that the phase shift region 115 may be omitted from the laser diode 100 when the laser diode can be constructed such that there is formed a sufficient concentration of optical radiation in the resonator structure 103a and when the electrode 109 is provided in correspondence to the maximum of the intensity of optical radiation. For example, when there is a sufficiently sharp peak in the curve O which represents the intensity distribution in the case where the region 115 is not provided, the laser diode can operate satisfactorily although there may be a degradation in the efficiency of modulation.

Figure 12B:
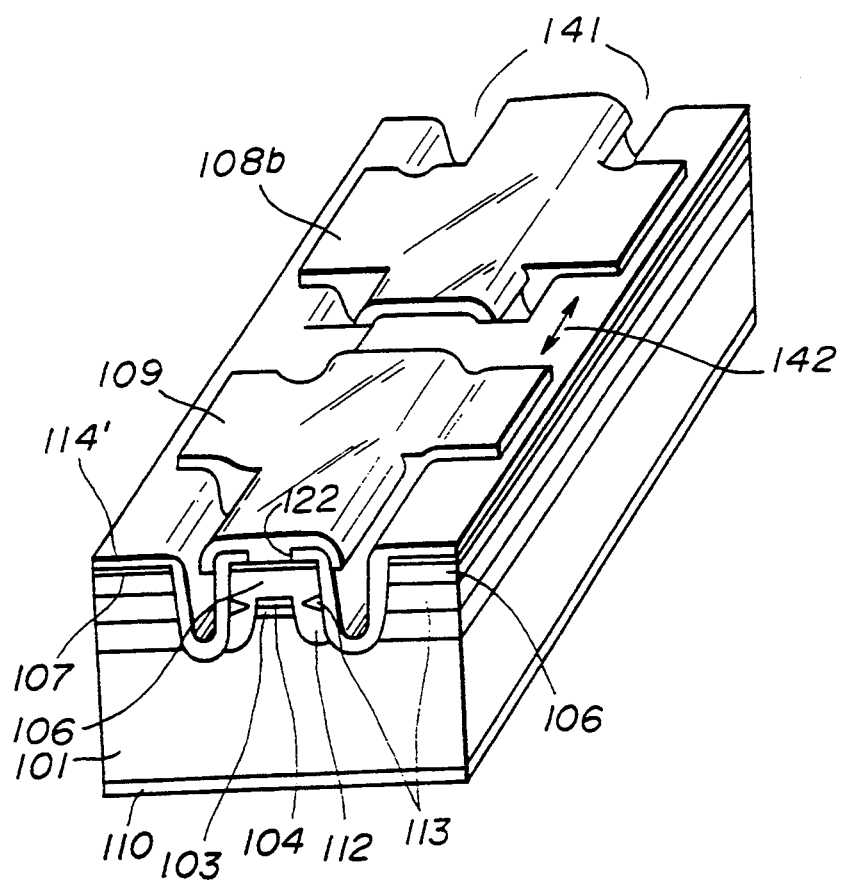
FIG. 12B is a perspective view showing a part of the DFB laser diode of FIG. 12A in a state that the laser diode is sectioned transversally along a line 12-12' of FIG. 12A.

Next, a second embodiment of the present invention will be described with reference to FIGS. 12A and 12B showing a DFB laser diode 100' of the second embodiment wherein FIG. 12A shows a plan view and FIG. 12B shows a perspective cross-sectional view taken along a line 12-12'.

Referring to FIG. 12B at first, the DFB laser diode 100' has a layered structure of the semiconductor layers 101-107 similar to that of the first embodiment except that there is provided a pair of grooves 141 at both sides of the mesa structure such that the grooves 141 extend from the surface of the structure 100' and reach the substrate 101. It should be noted that there are a plurality of grooves 141 along the longitudinal direction of the structure 100' respectively in correspondence to the electrodes 108a, 109 and 108b wherein each of the grooves aligned along the longitudinal direction is separated from an adjacent groove or grooves by a separation region 142. Further, the surfaces of the grooves 141 as well as the top surface of the contact layer 107 including the separation region 142 are covered by an insulator film 114' which is formed with an opening 122 by which the electrode 108a, 108b or 109 comes into contact with the contact layer 107. Each of the grooves 141 has a depth of about 3–4 μm and are disposed with a separation of about 10–20 μm from each other in the lateral direction, thus forming a second mesa structure between the opposing grooves 141.

According to the present invention, the second mesa region is isolated by the grooves 141 from the region beyond the grooves 141 and thereby the influence of the parasitic capacitance formed at the boundary between the p-type layer 112 and the n-type region 113 is eliminated by the grooves 141. As the grooves are separated from each other in the longitudinal direction of the laser diode 100' by the separation regions 142, the problem of unwanted conduction between the segmented electrodes 108a, 108b and 109 which may occur because of incomplete patterning when the grooves are continuous, is positively prevented. As the separation region 142 forms an absorption region in the active layer 104 because of the absence of carrier injection, it is desirable that the length of the region 142 chosen to be about 10–30 μm. As a result of the foregoing construction, a high speed modulation exceeding 1 GHz and reaching about 10 GHz can be achieved with reliability.

Next, the fabrication process of the DFB laser diode of the present invention will be described with reference to FIGS. 13A–13F.

Figure 13:
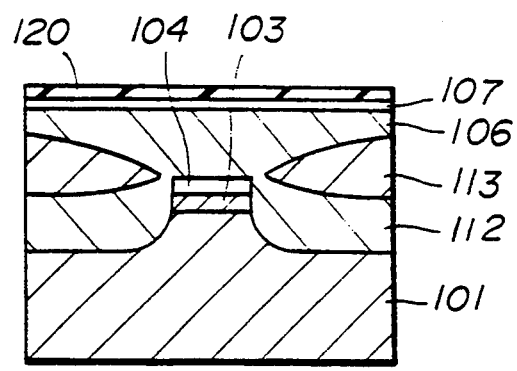
FIGS. 13A–13F are diagrams showing fabrication steps of the laser diode of FIG. 12A.
Figure 13:
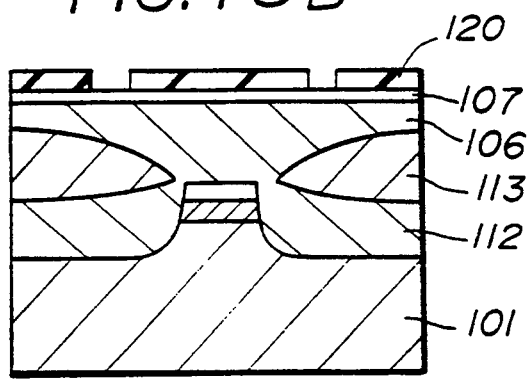
Figure 13:
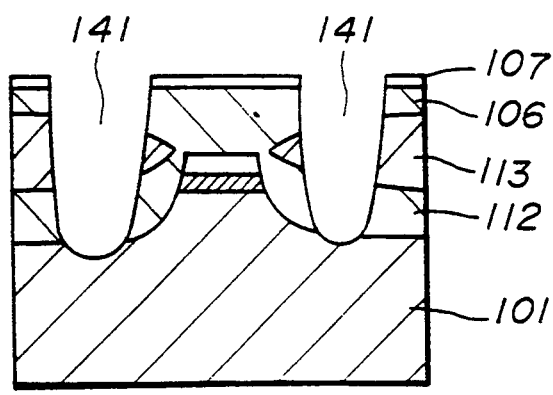

Referring to FIG. 13A, a buried structure of semiconductor layers forming the laser diode 100 is formed by stacking consecutively the n-type GaInAsP waveguide layer 103, the undoped GaInAsP active layer 104, and the p-type InP clad layer 106 on the n-type InP substrate, selectively etching the layered structure thus formed by using a suitable silicon oxide mask (not illustrated) to form the mesa structure having a width of 1–2 μm, depositing the p-type InP layer 112 and the n-type InP clad layer 106 consecutively to bury the mesa structure together with ion implantation and following annealing processes to form the buried layer 113 in correspondence to the boundary between the layer 112 and the layer 106, removing the silicon oxide mask, and depositing the p+type GaInAsP contact layer 107 on the clad layer 106. Further, a photoresist 120 is deposited on the contact layer 107 as shown in FIG. 13A.

Next, the photoresist 120 is patterned in accordance with the groove 141 to be formed in the structure of FIG. 13A and openings are formed in the photoresist 120 as shown in FIG. 13B.

Figure 13D:
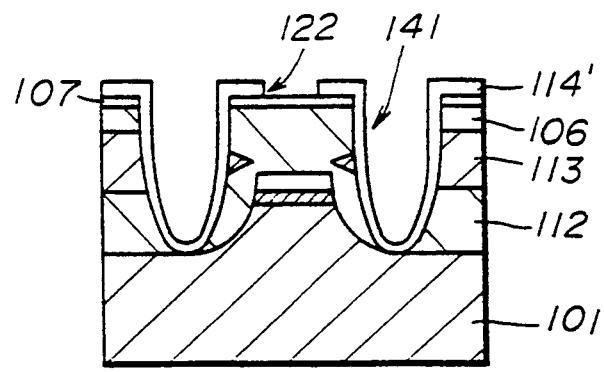

Next, using the photoresist 120 as the mask, the grooves 141 are formed by etching as shown in FIG. 13C and the surface of the groove 141 as well as the top surface of the contact layer 107 is covered by the silicon oxide film 114'. It should be noted that there is formed another mesa structure by the pair of grooves 141 as shown in FIG. 13C and FIG. 13D. This second mesa structure may typically have a width of 5–8 μm. Further, an opening 122 is formed in the silicon oxide film 114' to allow for electrical contact between the contact layer 107 and the electrode 108a, 108b or 109 provided thereon and a structure shown in FIG. 13D is formed.

Figure 13E:
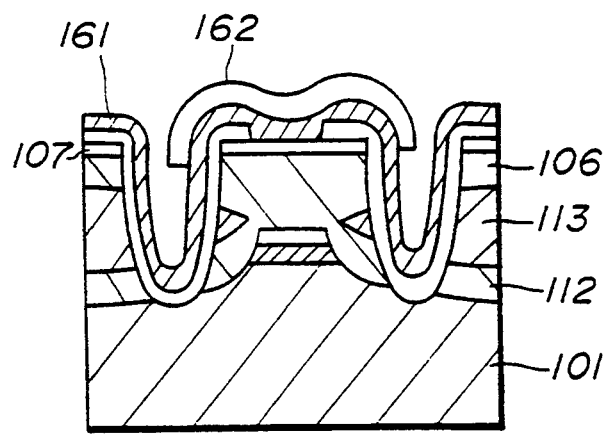
Figure 13F:
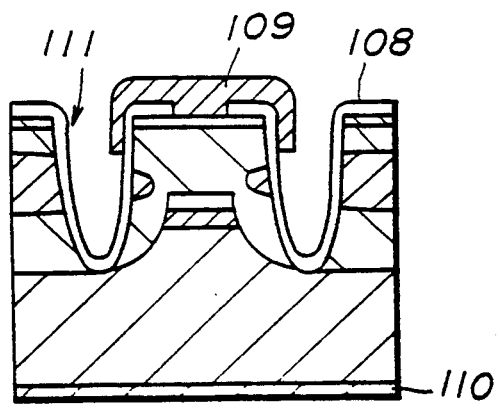

Next, a titanium/platinum layer 161 is provided on the silicon oxide film 114' uniformly as shown in FIG. 13E, and after providing a suitable resist pattern (not shown) on the titanium/platinum layer 161 in correspondence to the groove 141, a gold/germanium/nickel layer 162 is deposited on the titanium/platinum layer 161. Thereby, a structure shown in FIG. 13E is formed. Next, the resist pattern is removed and the layer 161 is selectively removed by a reactive ion etching process (RIE) using the layer 162 as the mask. As a result, a structure shown in FIG. 13F corresponding to the cross section shown at the end of the perspective view of FIG. 12B is obtained. It should be noted that the structure thus obtained has the electrodes 108a, 109 and 108b which are segmented and separated completely from each other as can be seen in FIGS. 12A and 12B.

It should be noted that the deposition of the electrodes 108a, 108b and 109 can be made such that a part of the electrodes extend laterally across the grooves 141, thus filling the grooves without difficulty by simply omitting the photoresist and etching process at the time of deposition of the electrode layers 161 and 162. Thus, the laser diode formed with the grooves 141 and having the electrodes 108a, 108b and 109 as shown in FIG. 12B is fabricated. As the grooves 141 are segmented in the longitudinal direction, there is no risk that the separation between the electrodes 108a, 108b and 109 will be not incomplete and a reliable operation of the laser diode can be achieved.

In the laser diode fabricated as such, it should be noted that grooves 141 are divided into segments in the elongated direction of the laser diode. Thereby, the electrical separation between the segmented electrodes 108a, 108b and 109 becomes complete and short circuiting between the electrodes is positively prevented. Further, the unwanted effect of the parasitic capacitance is reduced by the provision of the grooves 141 as already described.

Next, a description with respect to the mask used for forming the grooves 141 by etching will be made.

Figure 14A:
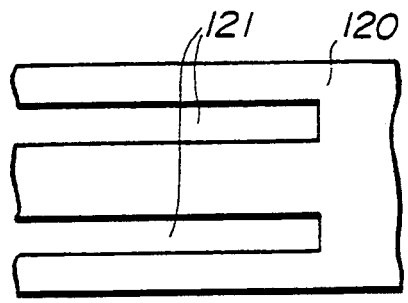
FIGS. 14A and 14B are diagrams respectively showing a conventional mask used for providing isolation grooves in the DFB laser diode of FIG. 12A and the isolation grooves thus formed respectively.
Figure 14B:
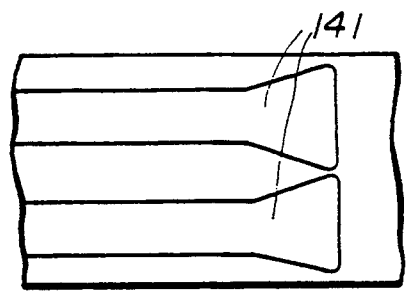

FIG. 14A shows a typical example of the mask used in fabrication of semiconductor devices for forming grooves in a semiconductor structure and FIG. 14B shows an example of the grooves formed by the mask of FIG. 14A. As will be noted in FIG. 14B, the grooves 141 formed by using the mask having straight ends at the ends of the openings 121, have enlarged ends which appear as a result of the different etching rate in the crystal orientation of the semiconductor crystal. As the active layer 104 is formed between the grooves 141, such enlarged ends of the grooves 141 may cause a serious degradation in the efficiency of laser oscillation. It should be noted that the width of the active layer 104 is only about 1–2 μm.

Figure 15A:
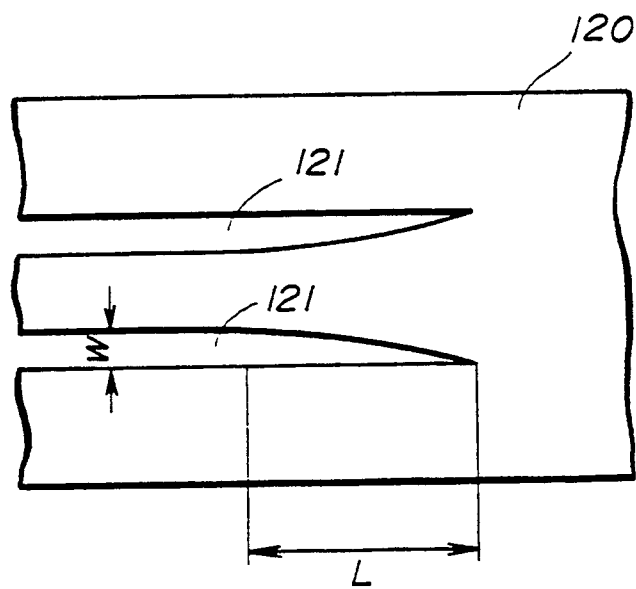
FIGS. 15A–15C are diagrams showing the embodiments of masks used in the second embodiment of the present invention for forming the isolation grooves.
Figure 15B:
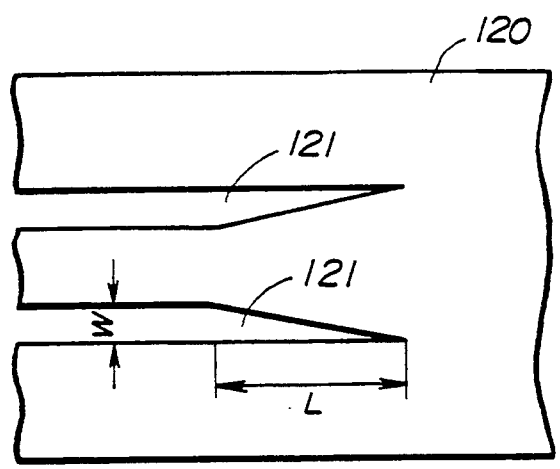
Figure 15C:
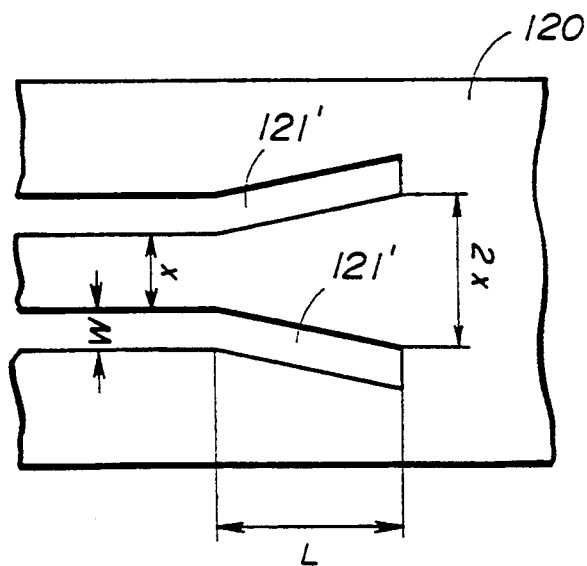
Figure 16:
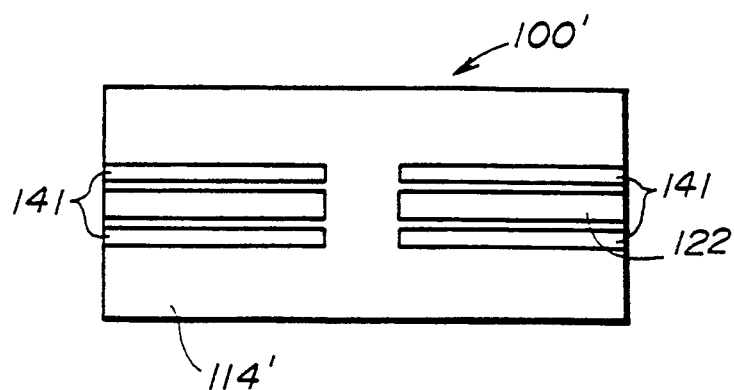
FIG. 16 is a plan view showing a part of the laser diode fabricated by the process of FIG. 15D.

In the present invention, a mask shown in FIGS. 15A or 15B is used for forming the grooves 141 without the enlargement of the grooves at the end thereof, wherein each of the masks has the opening 121 in which the width W of the opening is decreased gradually towards the end of the grooves 141, in which FIG. 15A shows a case that the opening 121 has a curved edge and FIG. 15B shows a case that the opening 121 has a straight edge. The length of the end region L in which the width W is changed gradually may be chosen to be 4–5 times as large as the maximum of the width W. Alternatively, the grooves 141 may be formed by using the mask of FIG. 15C. In this mask, there is formed a pair of elongated openings 121' with a separation between them which increases toward the end of the openings in correspondence to the end region L. Thereby, the separation between the openings 121' at the end thereof may be increased twice as large as the separation x between the openings 121' outside the region L. Using the mask as disclosed in FIGS. 15A–15C, one can obtain substantially straight grooves 141. FIG. 16 shows a plan view of the structure formed as a result of the step of FIG. 13D. As can be seen in the drawing, the grooves 141 are segmented or separated from each other in the longitudinal direction of the laser diode 100' and have an end part defined without any enlargement in contrast to the conventional groove shown in FIG. 14B.

Next, the process of forming the phase shift region 115 in the diffraction grating 102 will be described briefly with reference to FIG. 17. A more complete description will be found in an article by Shirasaki et al. (M. Shirasaki, H. Soda, S. Yamakoshi and H. Nakajima, "λ/4-shifted DFB-LD Corrugation Formed by a Novel Spatial Phase Modulating Mask", 5th International Conference on Integrated Optics and Optical Fiber Communication, 11th European Conference on Optical Communication (IOOC-ECOC'85), Venetia, Italy, Oct. 1–4, 1985, Technical Digest Vol.1, pp.25–28) which is incorporated herein by a reference.

Figure 17:
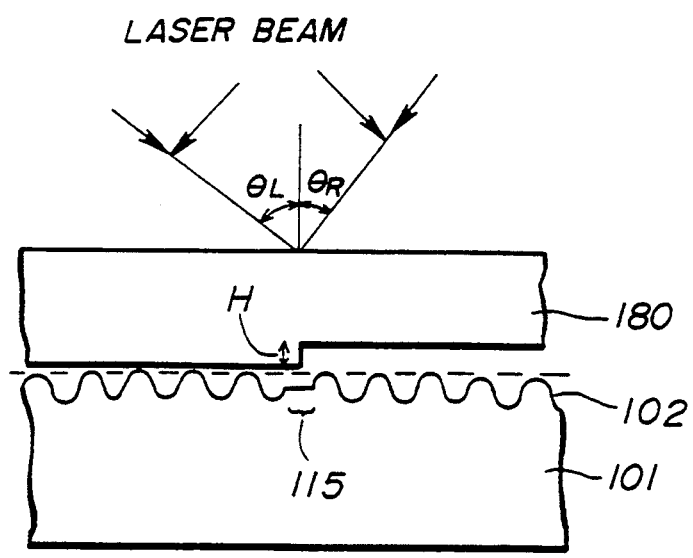
FIG. 17 is a schematical diagram showing a process of forming a diffraction grating with a λ/4 phase shift region in the corrugation forming the grating.

Referring to FIG. 17, a pair of laser beams from an argon or helium-cadmium laser are irradiated on the substrate 101 coated by a photoresist with two mutually different angles of incidence $\theta_L$ and $\theta_R$ through a transparent phase plate 180 of quartz which is provided with a step H of 2.2 μm in correspondence to where the phase shift region 115 is provided. It should be noted that the optical path of the laser beam incident to the plate at the left of the step H is different from the optical path at the right of the step H, and as as a result, there appears a shift of the regularly repeated interference bands, which are formed on the photoresist as a result of the interference of the two laser beams, in correspondence to the step H. After the foregoing exposure of the photoresist, the substrate 101 is patterned using the exposed photoresist, and a corrugation including the phase shift of λ/4 corresponding to the phase shift region 115 is formed on the substrate 101 as the grating 102 as shown in FIG. 17.

Figure 18:
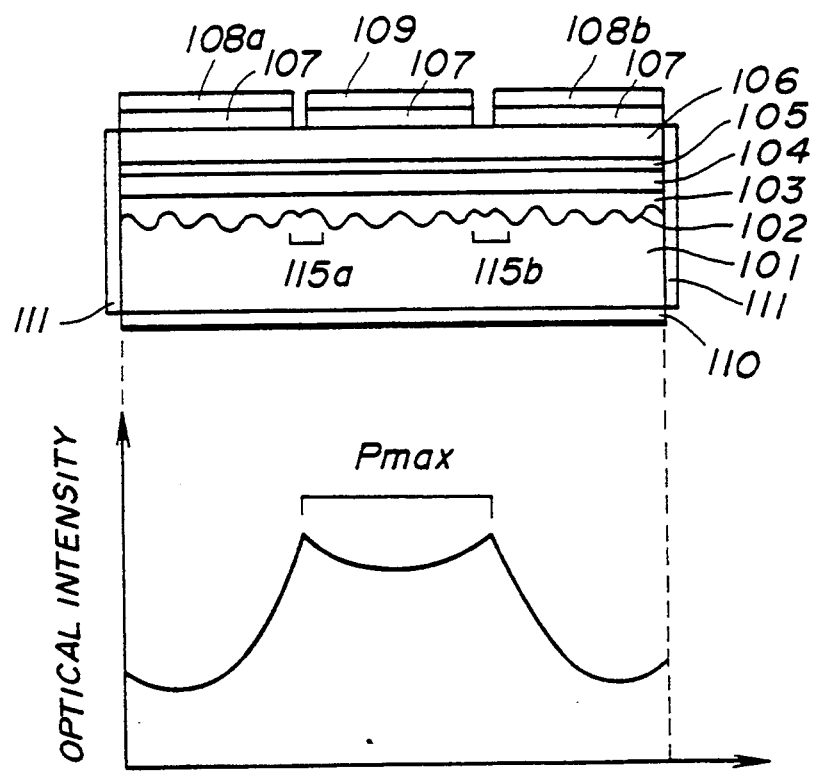
FIG. 18 is a diagram showing the structure of a third embodiment of the DFB laser diode according to the present invention and the optical intensity distribution realized by the structure.

Next, a third embodiment of the present invention will be described with reference to FIG. 18. In FIG. 18, the parts corresponding to those already described with reference to the preceding drawings will be designated by the same reference numerals and the description thereof will not be repeated.

Referring to FIG. 18, the DFB laser diode has two phase shift regions 115a and 115b generally in correspondence to the gap between the electrodes 108a and 109 and the gap between the electrodes 109 and 108b, respectively. Thereby, there appears two peaks in the intensity distribution of the optical radiation established in the resonator structure 103a and in correspondence to this, the intensity of the optical radiation under the electrode 109 is increased uniformly. More specifically, the intensity of the peak Pmax of the optical radiation has a width corresponding to the electrode 109 and the efficiency of modulating the oscillation wavelength in response to the modulation signal applied to the electrode 109 is improved. In other words, a large shift of the oscillation wavelength of the laser diode can be achieved by the structure of FIG. 18. It should be noted that the location of the phase shift regions 115a and 115b may be chosen such that there appears the maximum Pmax with a width generally corresponding to the electrode 109 and with a sufficient height, and the location is not limited to the location corresponding to the gap between the electrodes 108a and 109 or the gap between the electrodes 109 and 108b.

Next, a fourth embodiment of the DFB laser diode of the present invention will be described with reference to FIG. 19.

In the embodiments described heretofore, the unhomogeneous distribution of the intensity of the optical radiation in the resonator structure 103a is artificially induced by the phase shift region 115 in the diffraction grating 102 as already described. In such a structure, there is a tendency that a laser oscillation of secondary mode is induced such that the intensity of laser oscillation is strongest at the ends of the resonator structure 103a and weakest at the center of the structure 103a. As such an oscillation mode is insensitive to the modulation signal applied to the electrode 109, it is desired that the intensity of laser oscillation in this secondary mode be suppressed as small as possible.

Figure 19:
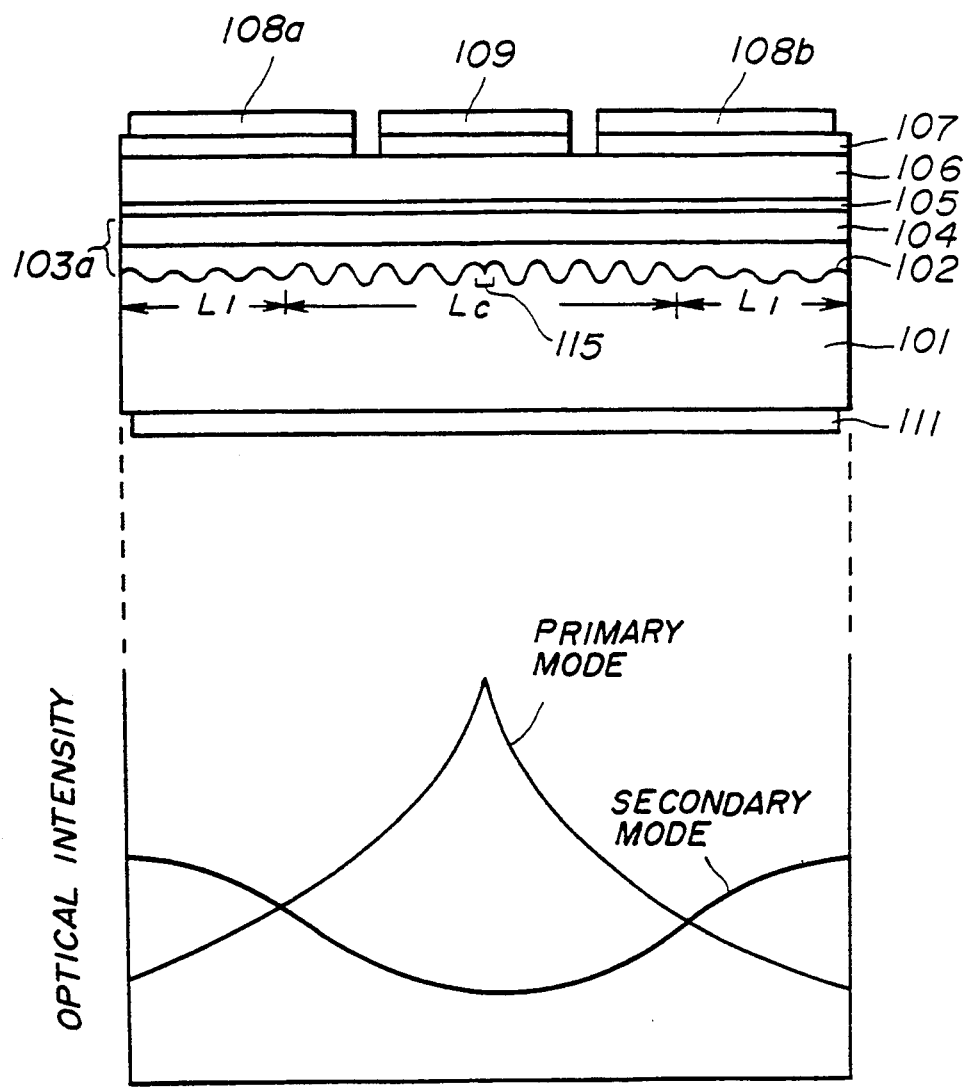
FIG. 19 is a diagram showing the structure of a fourth embodiment of the DFB laser diode according to the present invention.

The structure of FIG. 19 is designed to eliminate or suppress the unwanted secondary mode. Referring to FIG. 19, the depth of the corrugation forming the diffraction grating 102 is changed such that the depth of the diffraction grating is small at end parts L1 of the resonator structure 103a while the depth is large at the central part Lc of the resonator structure. Thereby, the quality factor Q of the resonator structure 103a is reduced in correspondence to the end parts thereof and the oscillation of the secondary mode having a large amplitude at the end parts of the resonator structure is effectively suppressed. At the same time, the primary mode having a large amplitude in correspondence to the central part of the resonator structure is effectively enhanced as shown in the lower part of FIG. 19.

Next, a fifth embodiment of the present invention for providing a flat and strong intensity of optical radiation in the part of the resonator structure 103a underneath the electrode 109 and a flat and weak intensity of optical radiation in correspondence to the part underneath the electrodes 108a and 108b together with the effective suppressing of the secondary mode, will be described with reference to FIGS. 20A and 20B.

Figure 20A:
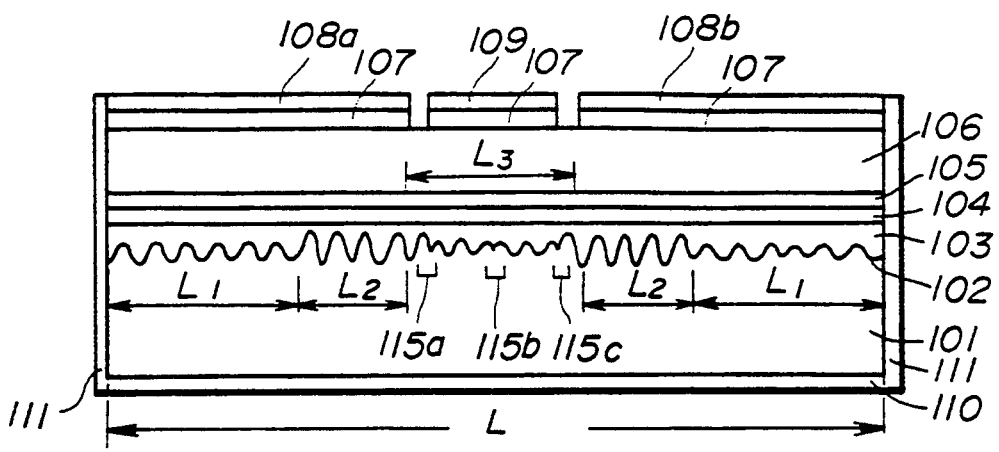
FIGS. 20A and 20B are diagrams showing the structure of a fifth embodiment of the DFB laser diode according to the present invention and the distribution of the optical radiation intensity obtained by the structure.
Figure 20B:
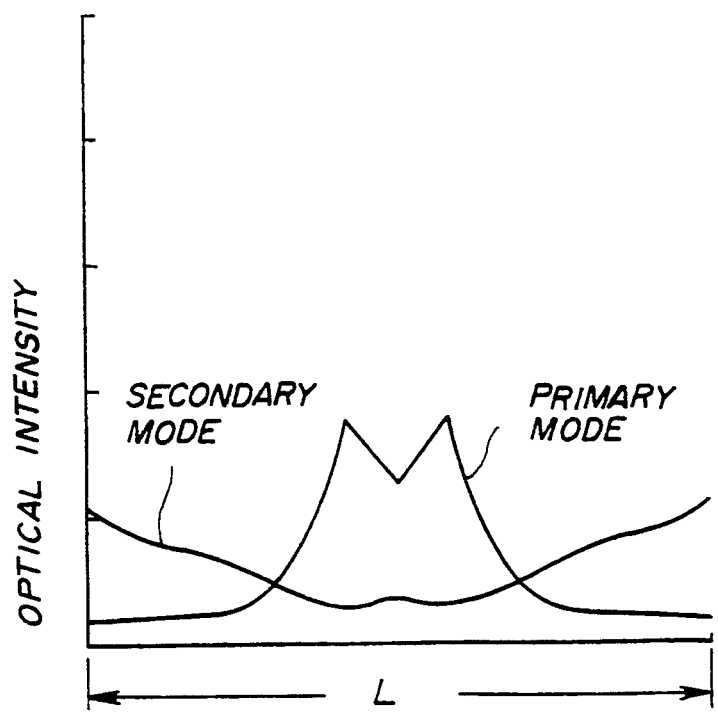

Referring to FIG. 20A, there are provided a plurality of phase shift regions 115a, 115b and 115c underneath the electrode 109 and associated therewith, an intensity distribution designated as PRIMARY MODE in FIG. 20B is established in the resonator structure 103a. Further, the depth of the corrugation forming the diffraction grading 102 is changed as shown in FIG. 20A such that depth of corrugation is reduced in correspondence to both ends L1 of the resonator structure 103a and in correspondence to the center L3 of the structure 103a underneath the electrode 109, while the depth of corrugation is increased relatively in the intermediate region L2 as compared to the region L1 or region L3. By reducing the depth of corrugation at both ends of the resonator structure 103a, the coupling constant which represents the degree of interaction between the optical waves and the grating is reduced. In other words, the quality factor Q of the resonator in this region is reduced and the secondary mode laser oscillation having the maximum intensity in correspondence to this region is substantially reduced. On the other hand, the reduced corrugation depth at the central part of the electrode 109 contributes to flatten the sharp peak of the optical intensity in this region.

Next, the fabrication process of the diffraction grating 102 which is used in the embodiment of FIG. 20A will be described with reference to FIGS. 21A –21E.

Figure 21A:
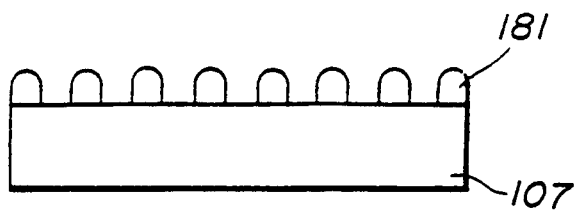
FIGS. 21A–21E are diagrams showing a process for forming the diffraction grating used in the DFB laser diode of FIG. 19 and FIG. 20A.

Referring to FIG. 21A, a negative photoresist 181 is deposited on the substrate 101 and patterned in accordance with an interference pattern of an argon or helium-cadmium laser defining the diffraction grating. During this process, the phase shift plate 180 as shown in FIG. 17 may be used.

Figure 21B:
Figure 21C:
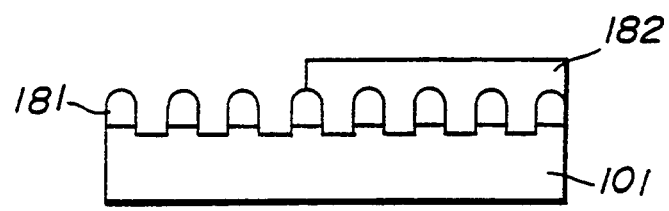

Next, in a step shown in FIG. 21B, the substrate 101 is etched slightly using the negative photoresist 181 as the mask, and in a step of FIG. 21C, a positive photoresist 182 is deposited in correspondence to the region where the depth of corrugation has to be shallow.

Figure 21D:
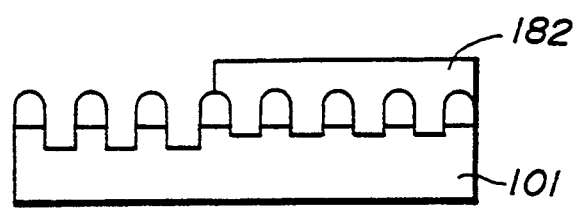
Figure 21E:
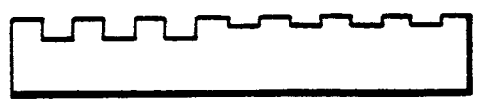

In a step of FIG. 21D, the substrate 101 is subjected to a further etching process wherein the part of the substrate 101 which is not protected by the photoresist 181 or by the photoresist 182 is grooved deeply as illustrated. After removal of the photoresist 181 and 182, the structure shown in FIG. 21E having different corrugation depths is obtained.

FIGS. 22A–22F show alternative steps for forming the diffraction grating 102 with different corrugation depths.

Figure 22A:
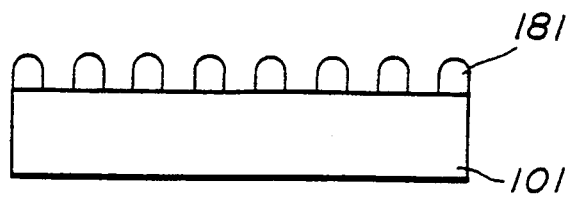
FIGS. 22A–22F are diagrams showing a different process for forming the diffraction grating used in the DFB laser diode of FIG. 20.
Figure 22B:
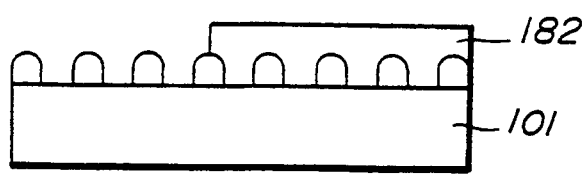

Referring to FIG. 22A, the substrate 101 carrying the negative photoresist 181 is patterned according to the diffraction grating 102, and the positive photoresist 182 is deposited selectively in a step of FIG. 22B so as to protect the region where the depth of corrugation is to be reduced.

Figure 22C:
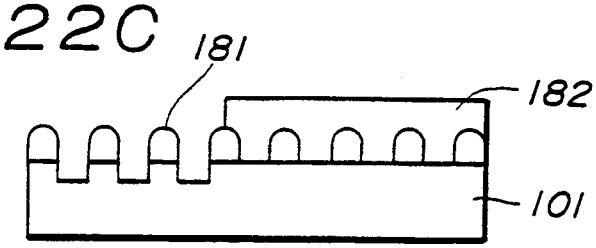
Figure 22D:
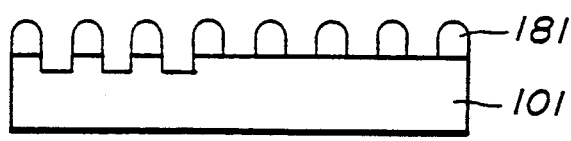

Next, in a step of FIG. 22C, the exposed part of the substrate 101 is grooved by etching and in a step of FIG. 22D, the positive photoresist 182 is removed. Thereby a structure, partially etched and protected selectively by the negative photoresist 181 is obtained.

Figure 22E:
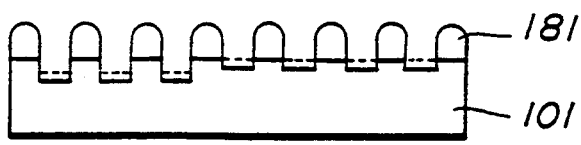
Figure 22F:
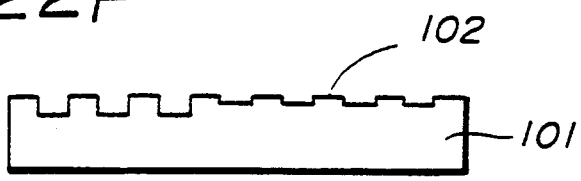

By applying the etching process again, there are formed deep corrugations in the region which has already been etched and shallow corrugations in the region which has been protected by the positive photoresist 182 as shown in FIG. 22E. By removing the photoresist 181, the diffraction grating 102 in which the depth of the corrugation is changed is obtained as shown in FIG. 22F.

Next, a sixth embodiment of the DFB laser diode of the present invention will be described with reference to FIGS. 23A and 23B. In the drawing, the parts corresponding to those which have been described previously with reference to the preceding drawings will be given identical reference numerals and the description thereof will be omitted.

Figure 23:
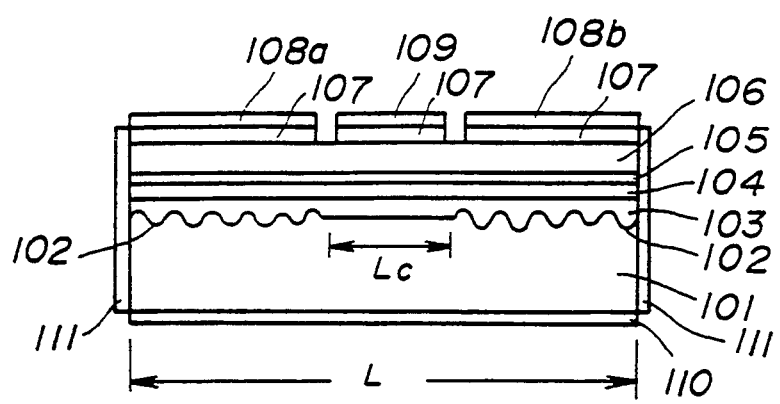
FIGS. 23A and 23B are diagrams showing the structure of a sixth embodiment of the DFB laser diode according to the present invention together with the intensity distribution of the optical radiation formed in the laser diode.
Figure 23:
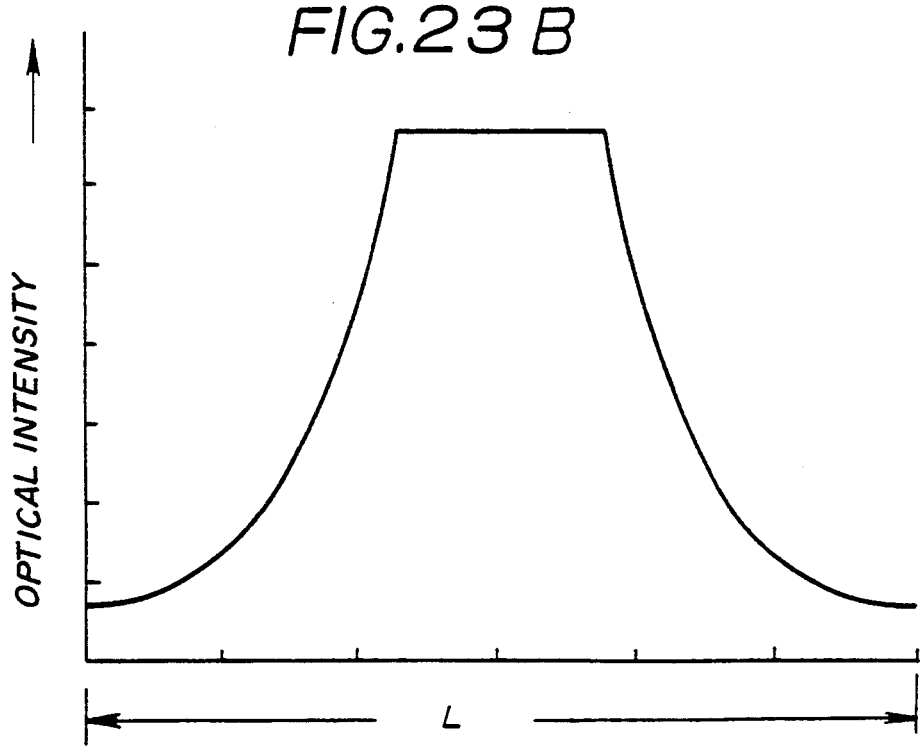

Referring to FIG. 23A showing the structure, the diffraction grating 102 of the laser diode is formed such that the corrugation is entirely eliminated from the central region Lc of the grating 102 immediately underneath the electrode 109. In response to the elimination of the corrugation from the region Lc, the sharp peak of the intensity distribution of the optical radiation in this region is flattened and a distribution profile of the optical radiation intensity as shown in FIG. 23B is obtained. It should be noted that there appears sufficient concentration of the optical radiation in this region because of the reflection from the corrugations forming the diffraction grating at both sides of the region Lc. As the high optical intensity exists in correspondence to the entire region Lc, the efficiency of modulation in response to the modulation signal applied to the electrode 109 is significantly improved.

Although the present invention has been described heretofore with the structure wherein the waveguide layer is provided between the substrate and the active layer, with the diffraction grating formed at an interface between the active layer and the waveguide layer, the present invention is by no means limited to such embodiments but the wave guide layer may be provided on the upper side of the active layer or at both sides of the active layer. Associated therewith, it should be noted that the diffraction grating may be provided along the top surface of the active layer. Further, the waveguide layer may be provided with a separation from the active layer as long as there is an optical interaction between the active layer and the waveguide layer such that the optical radiation formed in the active layer is transferred to the waveguide layer. In this case, the diffraction grating is provided not on the top or bottom surface of the active layer but with a separation from the active layer. Further, the present invention includes in the scope thereof the case in which the active layer has the multiple quantum well (MQW) structure in which a number of thin active layers with a thickness reduced to form a quantum well therein are sandwiched by a number of barrier layers providing the potential barrier defining the quantum well.

Further, the present invention is not limited to the embodiments described heretofore but various variations and modifications may be made without departing from the scope of the invention.

What is claimed is:

1. A method for fabricating a laser diode comprising a generally rectangular layered body elongated in a first direction, said layered body comprising a substrate, a waveguide layer provided on the substrate, an active layer further provided on the waveguide layer, said wave guide layer and said active layer forming a mesa structure projecting upwards from the substrate, and a clad layer defined by a top surface provided on the substrate so as to bury the mesa structure, said method comprising:

forming a plurality of segmented grooves separated from each other in the first direction on the clad layer in correspondence to both sides of the mesa structure such that each of the segmented grooves extends in the first direction and reaches a depth corresponding to the mesa structure;

providing an insulator layer on the clad layer including the segmented grooves;

providing a plurality of contact openings on the top surface of the insulator layer each in correspondence to a part of the clad layer existing between a pair of segmented grooves opposite to each other across the mesa structure; and providing a plurality of segmented electrodes respectively in correspondence to the plurality of contact openings.

2. A method for fabricating a laser diode according to claim 1, further providing the step of:

providing a radiation concentration unit for inducing a localized concentration of optical radiation in the active layer; and providing at least one of the segmented electrodes on the clad layer immediately above the radiation concentration unit.

3. A method for fabricating a laser diode according to claim 2, further comprising the step of:

providing at least one of the segmented electrodes in correspondence to a part of the active layer wherein optical radiation formed therein has a minimum intensity level, as a second segmented electrode.

4. A method for fabricating a laser diode according to claim 3, further comprising the step of:

providing the second said segmented electrode in correspondence to a first end of the active layer and in correspondence to a second end, opposite from the first end in a longitudinal direction, of the active layer.

* * * * *

UNITED STATES PATENT AND TRADEMARK OFFICE
CERTIFICATE OF CORRECTION

PATENT NO. : 5,358,898
DATED : October 25, 1994
INVENTOR(S) : Shouichi OGITA et al.

It is certified that error appears in the above-indentified patent and that said Letters Patent is hereby corrected as shown below:

Col. 1, line 8, change "07/789,429" to --07/789,427--.

Col. 5, line 8, change "the." to --the--.

Col. 7, line 13, change "$\lambda/4$" to --$\underline{\lambda}/4$--;
line 48, change "$\lambda_g$" to --$\underline{\lambda}_g$--;
line 68, change "$\lambda_g$" to --$\underline{\lambda}_g$--.

Col. 8, line 6, change "$\lambda_g$" to --$\underline{\lambda}_g$--;
line 16, change "cm$^{31\ 3}$" to --cm$^{-3}$--.

Col. 9, line 35, change "$\lambda/4$" to --$\underline{\lambda}/4$--; and change "$\lambda$" to --$\underline{\lambda}$--.

Col. 16, line 15, change "$\lambda/4$-shifted" to --$\underline{\lambda}/4$-shifted--;
line 25, change "$\theta_L$" to --$\underline{\theta}_L$--; and change "$\theta_R$" to --$\underline{\theta}_R$--.

Signed and Sealed this

Third Day of January, 1995

Attest:

BRUCE LEHMAN

*Attesting Officer*    *Commissioner of Patents and Trademarks*